(12) United States Patent
Fang et al.

(10) Patent No.: US 11,312,730 B2
(45) Date of Patent: Apr. 26, 2022

(54) METAL COMPLEXES CONTAINING CYCLOPENTADIENYL LIGANDS

(71) Applicant: MERCK PATENT GMBH, Darmstadt (DE)

(72) Inventors: Ming Fang, Somerville, NJ (US); Joby Eldo, Somerville, NJ (US); Charles Dezelah, Somerville, NJ (US); Daniel Moser, Somerville, NJ (US); Ravi Kanjolia, Somerville, NJ (US)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 16/347,028

(22) PCT Filed: Nov. 3, 2017

(86) PCT No.: PCT/EP2017/001283
§ 371 (c)(1),
(2) Date: May 2, 2019

(87) PCT Pub. No.: WO2018/086730
PCT Pub. Date: May 17, 2018

(65) Prior Publication Data
US 2019/0276477 A1 Sep. 12, 2019

Related U.S. Application Data

(60) Provisional application No. 62/418,981, filed on Nov. 8, 2016.

(51) Int. Cl.
*C07F 5/00* (2006.01)
*C23C 16/18* (2006.01)
*C23C 16/455* (2006.01)
*C23C 14/12* (2006.01)
*H01L 21/02* (2006.01)

(52) U.S. Cl.
CPC .............. *C07F 5/00* (2013.01); *C23C 14/12* (2013.01); *C23C 16/18* (2013.01); *C23C 16/45553* (2013.01); *H01L 21/0228* (2013.01); *H01L 21/02192* (2013.01); *H01L 21/02274* (2013.01)

(58) Field of Classification Search
CPC . C07F 5/00; C23C 14/12; C23C 16/18; C23C 16/45553; H01L 21/02192; H01L 21/02274; H01L 21/0228
See application file for complete search history.

(56) References Cited

U.S. PATENT DOCUMENTS

| 8,653,290 B2 | 2/2014 | Saitama |
| 2009/0302434 A1 | 12/2009 | Pallem et al. |
| 2017/0137552 A1* | 5/2017 | Oishi ............... C08F 210/02 |

FOREIGN PATENT DOCUMENTS

| DE | 10010513 A1 | 9/2001 | |
| JP | 2006013267 A | 1/2006 | |
| JP | 2008266523 A | * 11/2008 | |
| JP | 2008280384 A | * 11/2008 | |
| TW | 201506193 A | 2/2015 | |
| WO | WO-03048176 A1 | * 6/2003 | .............. C07F 17/00 |
| WO | 2008039960 A1 | 4/2008 | |
| WO | WO-2015190072 A1 | * 12/2015 | ............ C08F 236/10 |

OTHER PUBLICATIONS

Lorenz, Sara E., et al., "Synthesis and Reactivity of Bis(tetramethylcyclopentadienyl) Yttrium Metallocenes Including the Reduction of Me3SiN3 to [(Me3Si)2N]- with [(C5Me4H)2Y(THF)]2(μ-η2:η2-N2)" Inorganic Chemistry, 2010, 49, 6655-6663.*
Compounds Indexed by CAS from US 2019/0276477 (2019) (Year: 2019).*
IP.com, "Method of Depositing Metal Containing Thin Films by Vapor Phase Deposition From Cyclopentadienyl Based Lanthanide Metal-Organic Compounds" (No. IPCOM000172094D) (2008) (Year: 2008).*
IP.com Journal, CAS Abstract and Indexed Compounds IP 172094D (2008) (Year: 2008).*
S. Lorenz et al., 49 Inorganic Chemistry, 6655-6663 (2010) (Year: 2010).*
W. Evans et al., 104 Journal of the American Chemical Society, 2008-2014 (1982) (Year: 1982).*
CAS Abstract and Indexed Compound, W. Evans et al., 104 Journal of the American Chemical Society, 2008-2014 (1982) (Year: 1982).*
K. Smith et al., 10 Journal of the Chemical Society, Chemical Communications, 593-593 (1972) (Year: 1972).*
J. Bercaw et al., 5 Organometallics, 443-450 (1986) (Year: 1986).*
CAS Abstract and Indexed Compounds, J. Bercaw et al., 5 Organometallics, 443-450 (1986) (Year: 1986).*
E. Laur et al., 50 Macromolecules, 6539-6551 (2017) (Year: 2017).*
R. Rahman et al., 10 ACS Applied Materials & Interfaces, 32818-32827 (2018) (Year: 2018).*
T. Schroeder et al., 8 Dalton Transactions, 1030-1040 (2006) (Year: 2006).*
M. Thompson et al., 109 Journal of the American Chemical Society, 203-219 (1987) (Year: 1987).*
E. Bunel et al., 110 Journal of the American Chemical Society, 976-978 (1988) (Year: 1988).*
International Search Report and Written Opinion from PCT Application No. PCT/EP2017/001283 dated Feb. 5, 2018.
Han et al., "Reaction Chemistry during the Atomic Layer Deposition of $Sc_2O_3$ and $Gd_2O_3$ from $Sc(MeCp)_3$, $Gd(^iPrCp)_3$, and $H_2O$," Chemistry of Materials; 26: 1404-1412 (2014).
George, Steven M., "Atomic Layer Deposition: An Overview," Chemistry Review, 110: 111-131 (2010).

(Continued)

*Primary Examiner* — Alexander R Pagano
(74) *Attorney, Agent, or Firm* — Harness Dickey & Pierce P.L.C.

(57) ABSTRACT

Metal complexes including cyclopentadienyl ligands and methods of using such metal complexes to prepare metal-containing films are provided.

19 Claims, 17 Drawing Sheets

(56) References Cited

OTHER PUBLICATIONS

Putkonen et al., "Surface-Controlled Deposition of $Sc_2O_3$ Thin Films by Atomic Layer Epitaxy β-Diketonate and Organometallic Precursors," Chem. Mater., 13: 4701-4707 (2001).
Rouffignac et al., "ALD of Scandium Oxide from Scandium Tris(N,N'-diisopropylacetamidinate) and Water," Electrochemical and Solid-State Letters, 9(6): F45-F48 (2006).
Nyns et al., "Atomic layer deposition of scandium-based oxides," Phys. Status Solidi A, 2: 409-415 (2014).
Päiväsaari et al., "Atomic Layer Deposition of Rare Earth Oxides," Topics Appl. Physics, 106: 15-32 (2007).
Lorenz et al., "Synthesis and Reactivity of Bis(tetramethylcyclopentadienyl) Yttrium Metallocenes Including the Reduction of $Me_3SiN_3$ to $[(Me_3Si)_2N]$ with $[(C_5Me_4H)_2Y(THF)]_2(\mu-\eta^2:\eta^{2-N}{}_2)$," Inorganic Chemistry Article, 49: 6655-6663 (2010).
Evans et al., "Organolanthanide-Based Coordination and Insertion Reactivity of the Anion Formed by Deprotonation of ϵ-Caprolactam," Organometallics, 20: 4529-4536 (2001).
Database Caplus [Online], Chemical Abstracts Service, Columbus, OH, US, 1995, XP002777505.
Database Caplus [Online], Chemical Abstracts Service, Columbu, OH, US; 2008, XP002777509.
Becker et al., "Highly Conformal Thin Films of Tungsten Nitride Prepared by Atomic Layer Deposition from a Novel Precursor," Chem. Mater, 15:2969-2976 (2003).
Quisenberry et al., "Trimethylsilylated Allyl Complexes of Nickel. The Stabilized Bis(π-allyl) nickel Complex $[\eta^3-1,3-(SiMe_3)_2C_3H_3]_2Ni$ and its Mono(π-allyl)NiX (X=Br, I) Derivatives," J. AM. Chem. So., 127: 4376-4387 (2005).
Demir et al., "Synthesis, Structure, and Density Functional Theory Analysis of a Scandium Dinitrogen Complex, $[(C_5Me_4H)_2Sc]_2(\mu-\eta^2:\eta^2-N_2)$," J. AM. Chem. So., 132: 11151-11158 (2010).
Zhang et al., "Unusual modification methods for the ureido ligand of lanthanocene derivatives," Dalton Trans, 1168-1173 (2006).
Cosgriff et al., "New Lanthanoid (III) Complexes with Pyrazolate Ligands," Z. anorg. Allg. Chem., 622: 1399-1403 (1996).
Coutts et al., "New Organoscandium Compounds," Journal of Organometallic Chemistry, 25: 117-122 (1970).
W. J., Evans, et al., "Reactivity of $(C_5Me_5)_3LaL_x$ Complexes: Synthesis of a Tris(pentamethylcyclopentadienyl) Complex with Two Additional Ligands, $(C_5Me_5)_3La(NCCMe_3)_2$", Journal of the American Chemical Society, 131(7): 2678-2686 (2009).
S. S., Rozenel, et al., "Experimental and DFT Computational Study of β-Me and β-H Elimination Coupled with Proton Transfer: From Amides to Enamides in $Cp^*_2MX$ (M=La, Ce)," Organometallics, 36(1): 97-108 (2017).
H. J., Heeres, et al., "Organolanthanide-induced C—C bond formation. Preparation and properties of monomeric lanthanide aldolates and enolates," Organometallics, 11: 350-356 (1992).
H., Schumann, et al., "Synthesis, crystal structure and catalytic activity of some new chiral ansa-metallocenes of yttrium, lanthanum, samarium, lutetium and of zirconium," Journal of Organometallic Chemistry, 574: 228-240 (1999).
B. W., Pfennig, et al., "Luminescent $d^0$ scandocene complexes: photophysical studies and electronic structure calculations on $Cp^*_2ScX$ (X=Cl, I, Me)," Organometallics, 12: 649-655 (1993).
J. E., Bercaw, et al., "Carbon-hydrogen and carbon-carbon bond activation with highly electrophilic transition metal complexes," Pure and Appl. Chem., 62(6): 1151-1154 (1990).
Office Action issued in corresponding European Application No. 17807699.8 dated Oct. 14, 2020.
Office Action from corresponding Chinese Application No. 201780067987.0 dated Jul. 1, 2021.
Jeske, G., et al., "Highly Reactive Organolanthanides. Systematic Routes to and Olefin Chemistry of Early and Late Bis(pentamethylcyclopentadienyl) 4f Hydrocarbyl and Hydride Complexes," J. Am. Chem. Soc., 107(26): 8091-8103 (1985).
Bercaw, J.E., et al., "Reactions of Alkyl and Hydride Derivatives of Permethylscandocene and -zirconocene with Nitriles and Amines. Catalytic Hydrogenation of tert-Butyl Cyanide with Permethylscandocene Hydride," Organometallics, 5(3): 443-450 (1986).
den Haan, K.H., et al., "Reactions of Yttrium-Carbon Bonds with Active Hydrogen-Containing Molecules. A Useful Synthetic Method for Permethylyttrocene Derivatives," Organometallics, 6(10): 2053-2060 (1987).
Casey, C.P., et al., "Why propene is not polymerized by $(Cp2^*YH)2$: reactions of yttrium alkyl complexes with alkenes produce allyl and vinyl yttrium complexes," Journal of Organometallic Chemistry, 663: 91-97 (2002).
Vinogradov, S.A., et al., "Journal of the Chemical Society—Dalton Transactions (Inorganic Chemistry)," 16: 2679-2687 (1995).
Office Action from corresponding Japanese Application No. 2019-521798 dated Aug. 17, 2021.

* cited by examiner

METAL COMPLEXES CONTAINING CYCLOPENTADIENYL LIGANDS

CROSS-REFERENCE TO RELATED APPLICATIONS

This patent application is a U.S. national stage application under 35 U.S.C. § 371 of International Patent Application No. PCT/EP2017/001283 filed on 3 Nov. 2017, which claims the benefit of U.S. Provisional Patent Application No. 62/418,981 filed on 8 Nov. 2016. The entire disclosures of each of the above recited applications are incorporated herein by reference.

FIELD OF THE INVENTION

The present technology relates generally to metal complexes including cyclopentadienyl ligands, methods of preparing such complexes and methods of preparing metal-containing thin films using such complexes.

BACKGROUND

Various precursors are used to form thin films and a variety of deposition techniques have been employed. Such techniques include reactive sputtering, ion-assisted deposition, sol-gel deposition, chemical vapor deposition (CVD) (also known as metalorganic CVD or MOCVD), and atomic layer deposition (ALD) (also known as atomic layer epitaxy). CVD and ALD processes are increasingly used as they have the advantages of enhanced compositional control, high film uniformity, and effective control of doping. Moreover, CVD and ALD processes provide excellent conformal step coverage on highly non-planar geometries associated with modern microelectronic devices.

CVD is a chemical process whereby precursors are used to form a thin film on a substrate surface. In a typical CVD process, the precursors are passed over the surface of a substrate (e.g., a wafer) in a low pressure or ambient pressure reaction chamber. The precursors react and/or decompose on the substrate surface creating a thin film of deposited material. Volatile by-products are removed by gas flow through the reaction chamber. The deposited film thickness can be difficult to control because it depends on coordination of many parameters such as temperature, pressure, gas flow volumes and uniformity, chemical depletion effects, and time.

ALD is also a method for the deposition of thin films. It is a self-limiting, sequential, unique film growth technique based on surface reactions that can provide precise thickness control and deposit conformal thin films of materials provided by precursors onto surfaces substrates of varying compositions. In ALD, the precursors are separated during the reaction. The first precursor is passed over the substrate surface producing a monolayer on the substrate surface. Any excess unreacted precursor is pumped out of the reaction chamber. A second precursor is then passed over the substrate surface and reacts with the first precursor, forming a second monolayer of film over the first-formed monolayer of film on the substrate surface. This cycle is repeated to create a film of desired thickness.

Thin films, and in particular thin metal-containing films, have a variety of important applications, such as in nanotechnology and the fabrication of semiconductor devices. Examples of such applications include high-refractive index optical coatings, corrosion-protection coatings, photocatalytic self-cleaning glass coatings, biocompatible coatings, dielectric capacitor layers and gate dielectric insulating films in field-effect transistors (FETs), capacitor electrodes, gate electrodes, adhesive diffusion barriers, and integrated circuits. Dielectric thin films are also used in microelectronics applications, such as the high-κ dielectric oxide for dynamic random access memory (DRAM) applications and the ferroelectric perovskites used in infrared detectors and non-volatile ferroelectric random access memories (NV-FeRAMs). The continual decrease in the size of microelectronic components has increased the need for improved thin film technologies.

Technologies relating to the preparation of scandium-containing and yttrium-containing thin films (e.g., scandium oxide, yttrium oxide, etc.) are of particular interest. For example, scandium-containing films have found numerous practical applications in areas such as catalysts, batteries, memory devices, displays, sensors, and nano- and microelectronics and semiconductor devices. In the case of electronic applications, commercial viable deposition methods using scandium-containing and yttrium-containing precursors having suitable properties including volatility, low melting point, reactivity and stability are needed. However, there are a limited number of available scandium-containing and yttrium-containing compounds which possess such suitable properties. Accordingly, there exists significant interest in the development of scandium and yttrium complexes with performance characteristics which make them suitable for use as precursor materials in vapor deposition processes to prepare scandium-containing and yttrium-containing films. For example, scandium-containing and yttrium-containing precursors with improved performance characteristics (e.g., thermal stabilities, vapor pressures, and deposition rates) are needed, as are methods of depositing thin films from such precursors.

SUMMARY

According to one aspect, a metal complex of Formula I is provided: $[(R^1)_nCp]_2M^1L^1$ (I), wherein $M^1$ is a Group 3 metal or a lanthanide (e.g., scandium, yttrium and lanthanum); each $R^1$ is independently hydrogen, $C_1$-$C_5$-alkyl or silyl; n is 1, 2, 3, 4, or 5; Cp is cyclopentadienyl ring; and $L^1$ is selected from the group consisting of: $NR^2R^3$; $N(SiR^4R^5R^6)_2$; 3,5-$R^7R^8$—$C_3HN_2$; 1-$(R^{32})C_3H_4$; 1-$R^{33}$-3-$R^{34}$—$C_3H_3$; and $R^{35}$, $R^{36}$—$C_3HO_2$; wherein $R^2$, $R^3$, $R^4$, $R^5$, $R^6$, $R^7$, and $R^8$ are each independently hydrogen or $C_1$-$C_5$-alkyl; and $R^{32}$, $R^{33}$, $R^{34}$, $R^{35}$, and $R^{36}$ are each independently alkyl or silyl; wherein when $M^1$ is yttrium and $L^1$ is 3,5-$R^7R^8$—$C_3HN_2$, $R^1$ is $C_1$-$C_5$-alkyl or silyl; and wherein when $M^1$ is yttrium and $L^1$ is $N(SiR^4R^5R^6)_2$, n is 1, 2, 3, or 4.

In other aspects, a metal complex of Formula II is provided: $[((R^9)_nCp)_2M^2L^2]_2$ (II), wherein $M^2$ is a Group 3 metal or a lanthanide (e.g., scandium, yttrium and lanthanum); each $R^9$ is independently hydrogen or $C_1$-$C_5$-alkyl; n is 1, 2, 3, 4 or 5; Cp is cyclopentadienyl ring; and $L^2$ is selected from the group consisting of: Cl, F, Br, I, and 3,5-$R^{10}R^{11}$—$C_3HN_2$; wherein $R^{10}$ and $R^{11}$ are each independently hydrogen or $C_1$-$C_5$-alkyl; wherein when $M^2$ is scandium and $L^2$ is Cl, $R^9$ is $C_1$-$C_5$-alkyl.

In other aspects, methods of forming metal-containing films by vapor deposition, such as CVD and ALD, are provided herein. The method comprises vaporizing at least one metal complex corresponding in structure to Formula I: $(R^1Cp)_2M^1L^1$ (I), wherein $M^1$ is a Group 3 metal or a lanthanide (e.g., scandium, yttrium and lanthanum); each $R^1$ is independently hydrogen, $C_1$-$C_5$-alkyl or silyl; Cp is cyclopentadienyl ring; and $L^1$ is selected from the group consisting of: $NR^2R^3$; $N(SiR-^4R^5R^6)_2$; 3,5-$R^7R^8$—$C_3HN_2$; 1-($R^{32}$)$C_3H_4$; 1-$R^{33}$-3-$R^{34}$—$C_3H_3$; and $R^{35}$, $R^{36}$—$C_3HO_2$; wherein $R^2$, $R^3$, $R^4$, $R^5$, $R^6$, $R^7$, and $R^8$ are each independently hydrogen or $C_1$-$C_5$-alkyl; and $R^{32}$, $R^{33}$, $R^{34}$, $R^{35}$, and $R^{36}$ are each independently alkyl or silyl.

Other embodiments, including particular aspects of the embodiments summarized above, will be evident from the detailed description that follows.

DETAILED DESCRIPTION

Figure 1:
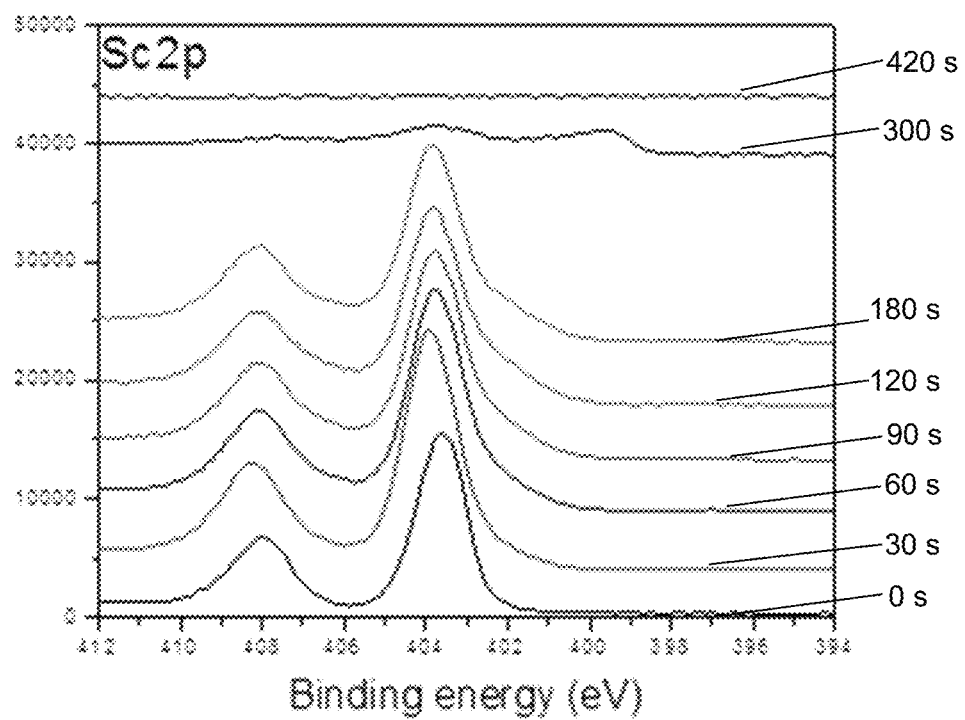
FIG. 1 illustrates XPS (X-ray Photoelectron Spectroscopy) analysis of $Sc_2O_3$ films using $Sc(MeCp)_2$(3,5-dimethyl-pyrazolate).
Figure 2:
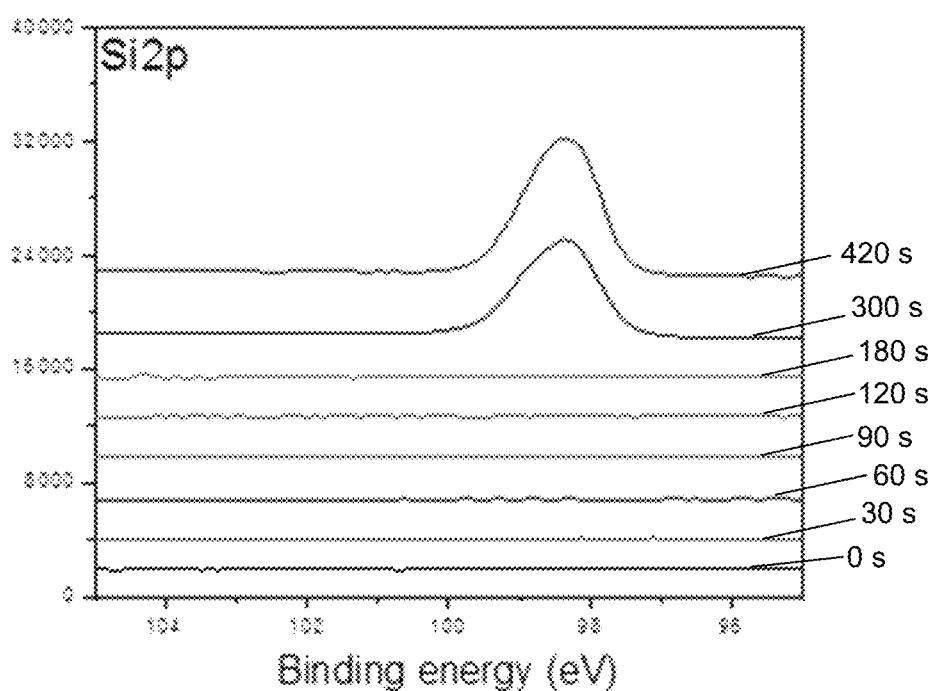
FIG. 2 illustrates XPS analysis of $Sc_2O_3$ films using $Sc(MeCp)_2$(3,5-dimethyl-pyrazolate).
Figure 3:
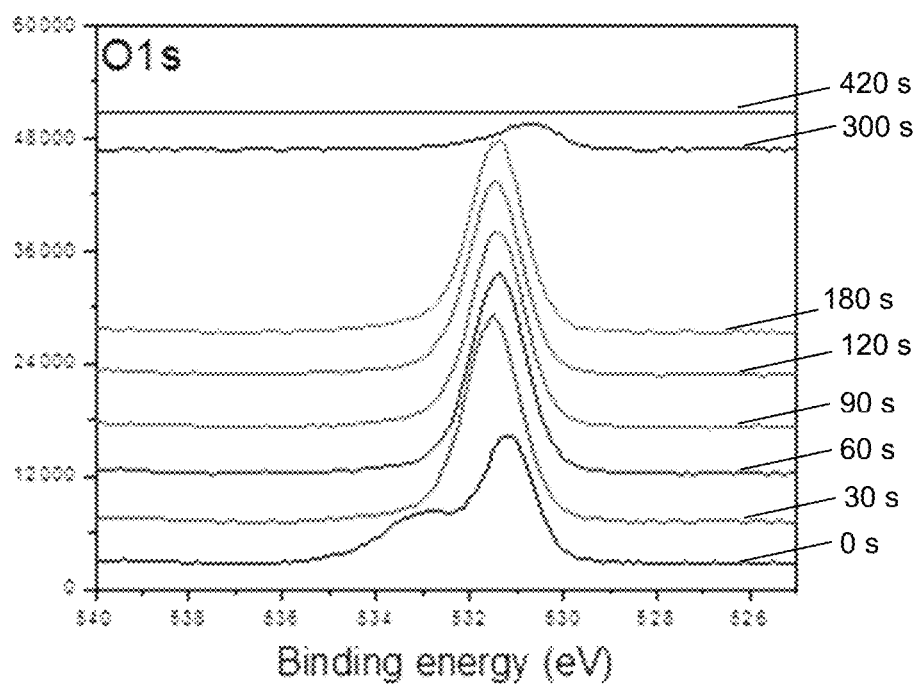
FIG. 3 illustrates XPS analysis of $Sc_2O_3$ films using $Sc(MeCp)_2$(3,5-dimethyl-pyrazolate).
Figure 4:
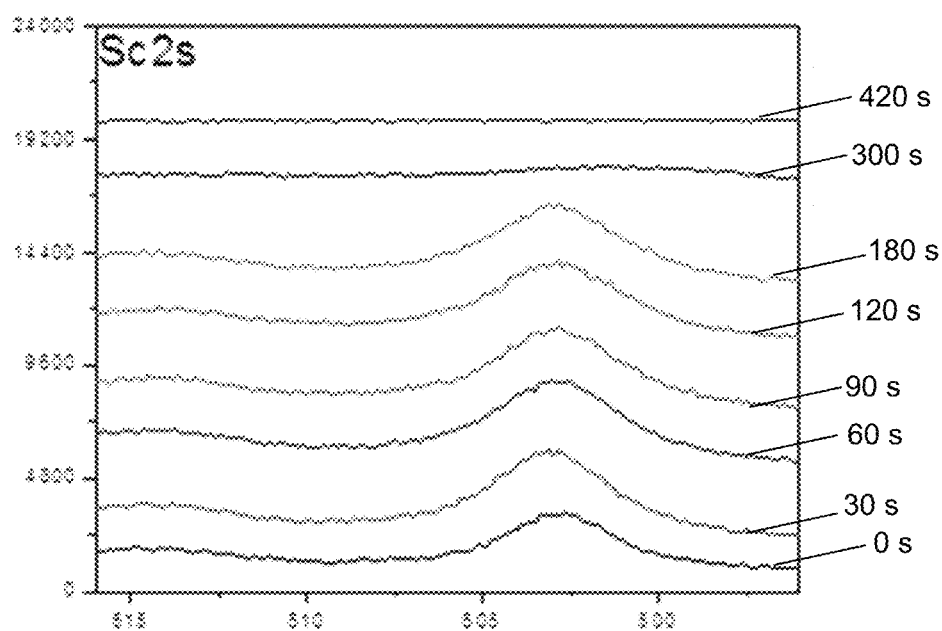
FIG. 4 illustrates XPS analysis of $Sc_2O_3$ films using $Sc(MeCp)_2$(3,5-dimethyl-pyrazolate.
Figure 5:
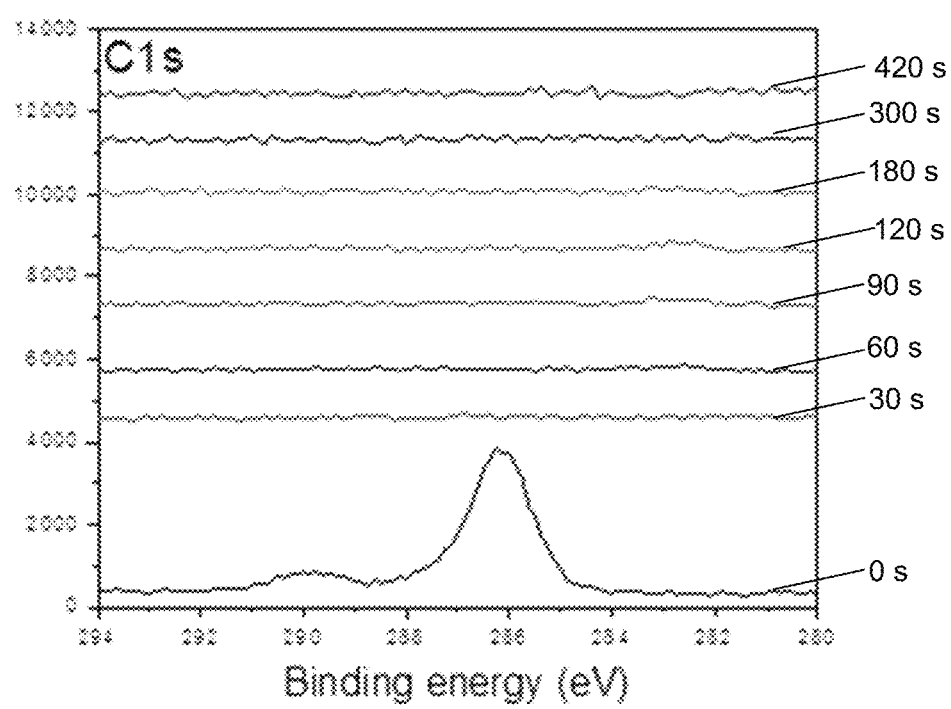
FIG. 5 illustrates XPS analysis of $Sc_2O_3$ films using $Sc(MeCp)_2$(3,5-dimethyl-pyrazolate).
Figure 6:
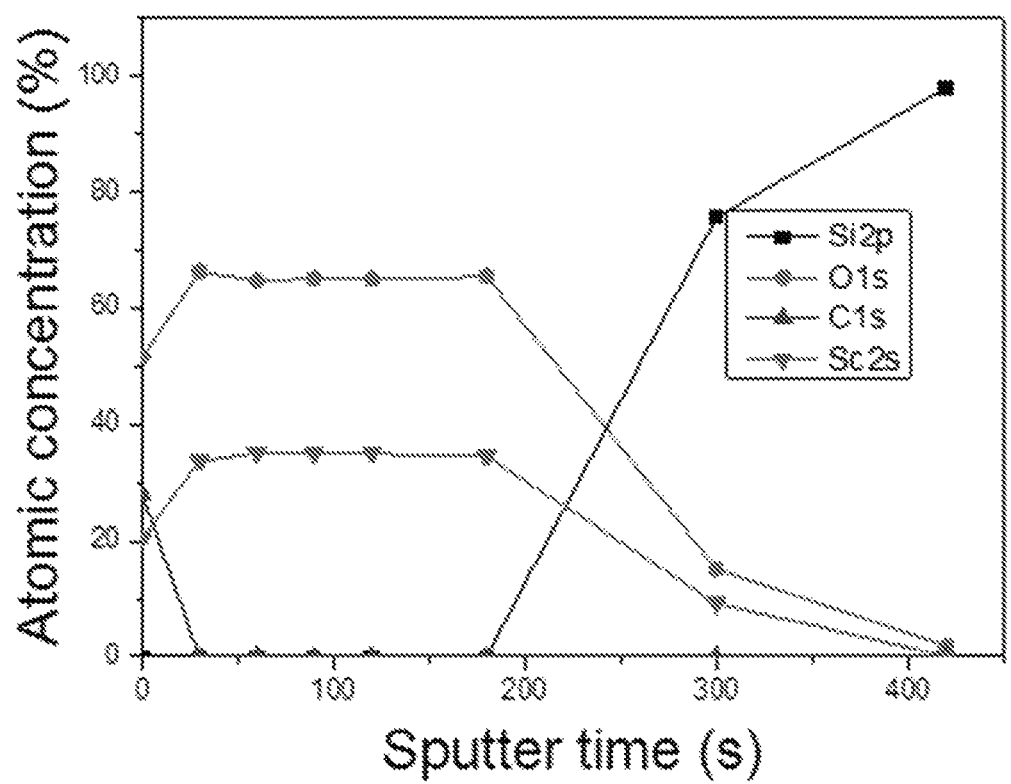
FIG. 6 illustrates XPS analysis of $Sc_2O_3$ films using $Sc(MeCp)_2$(3,5-dimethyl-pyrazolate).
Figure 7:
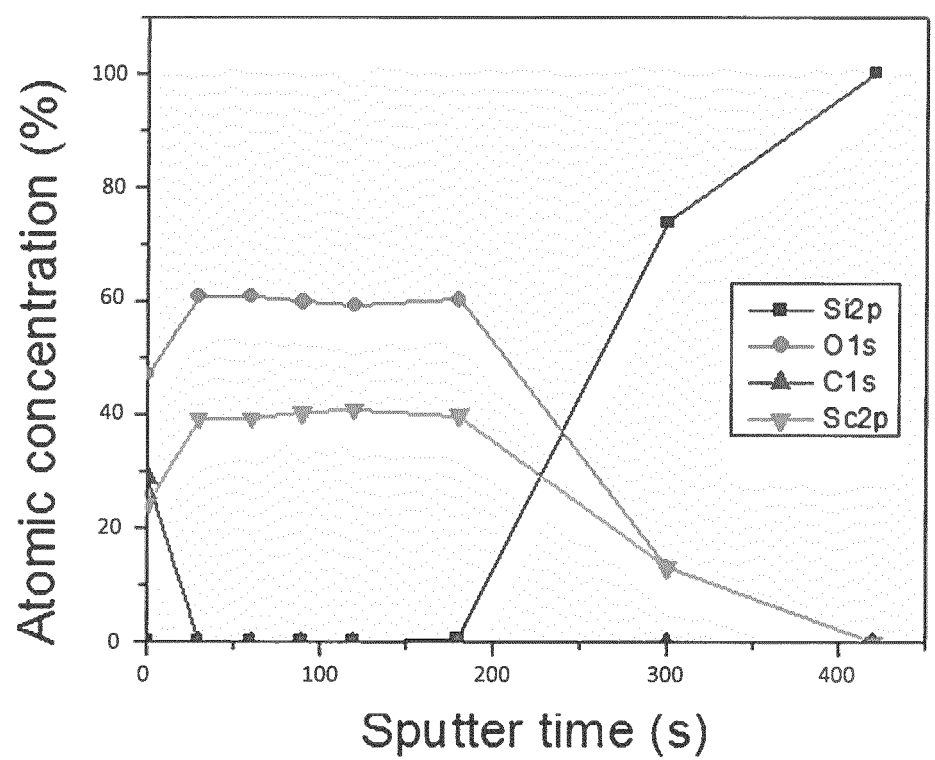
FIG. 7 illustrates XPS analysis of $Sc_2O_3$ films using $Sc(MeCp)_2$(3,5-dimethyl-pyrazolate).
Figure 8:
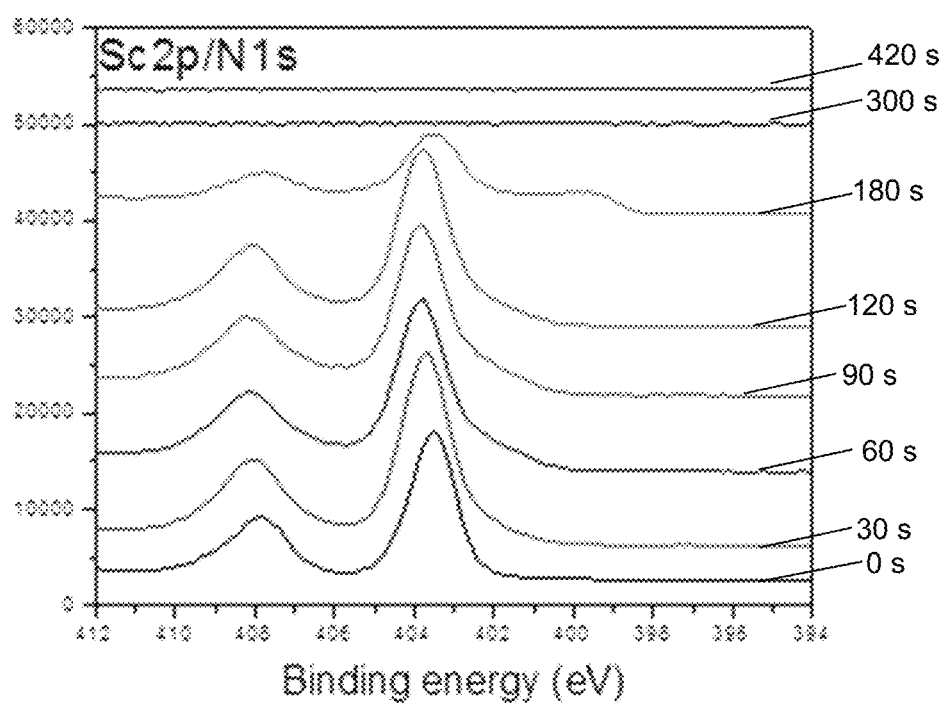
FIG. 8 illustrates XPS analysis of $Sc_2O_3$ films using $Sc(MeCp)_2$(3,5-dimethyl-pyrazolate).
Figure 9:
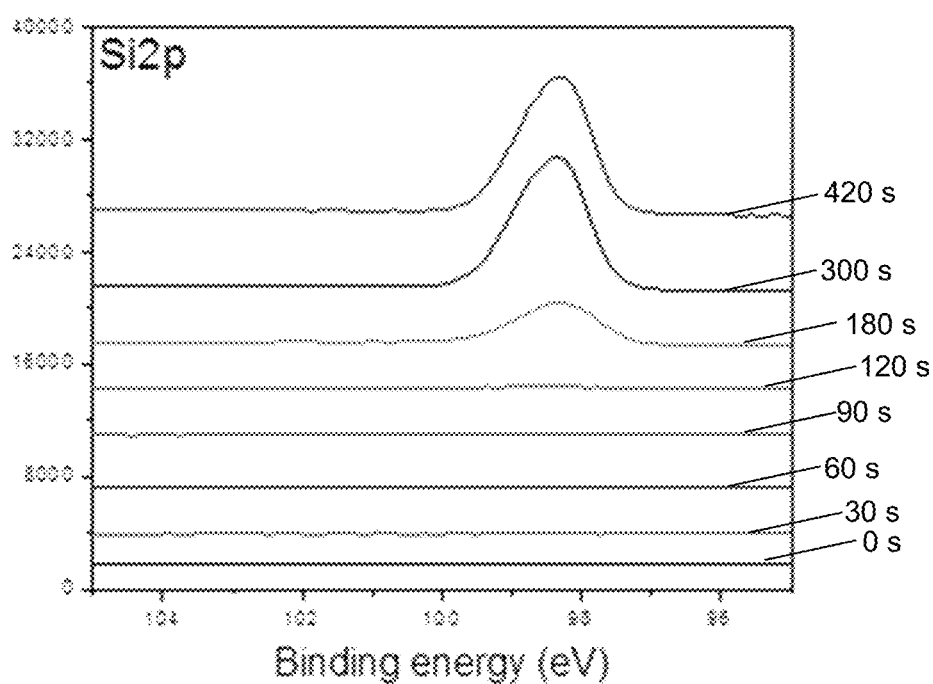
FIG. 9 illustrates XPS analysis of $Sc_2O_3$ films using $Sc(MeCp)_2$(3,5-dimethyl-pyrazolate).
Figure 10:
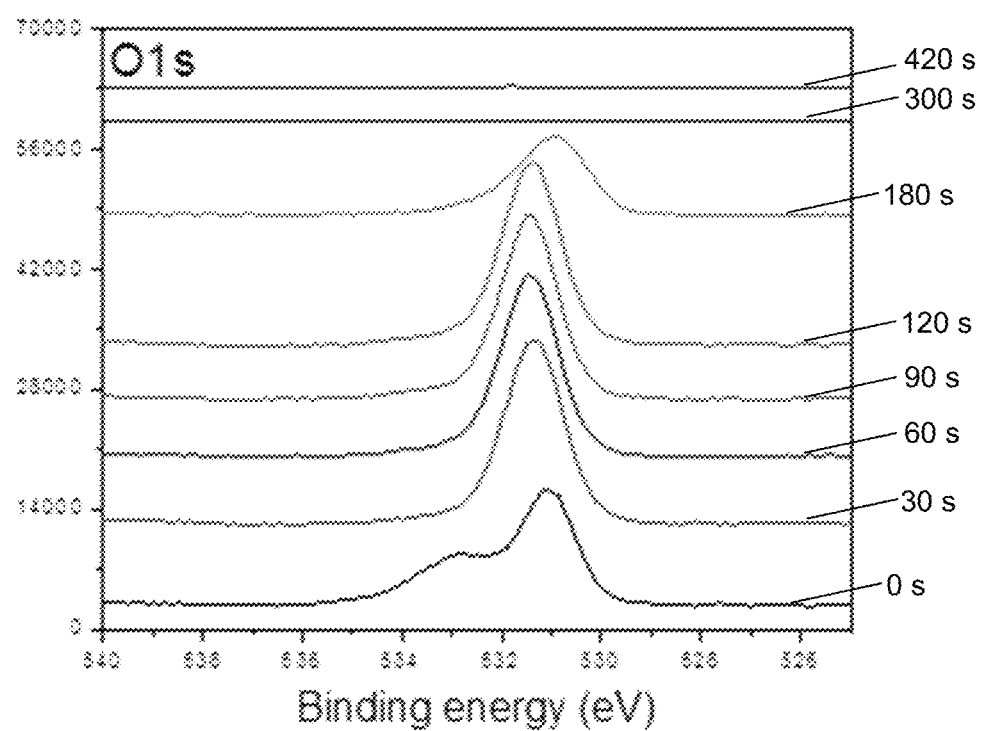
FIG. 10 illustrates XPS analysis of $Sc_2O_3$ films using $Sc(MeCp)_2$(3,5-dimethyl-pyrazolate).
Figure 11:
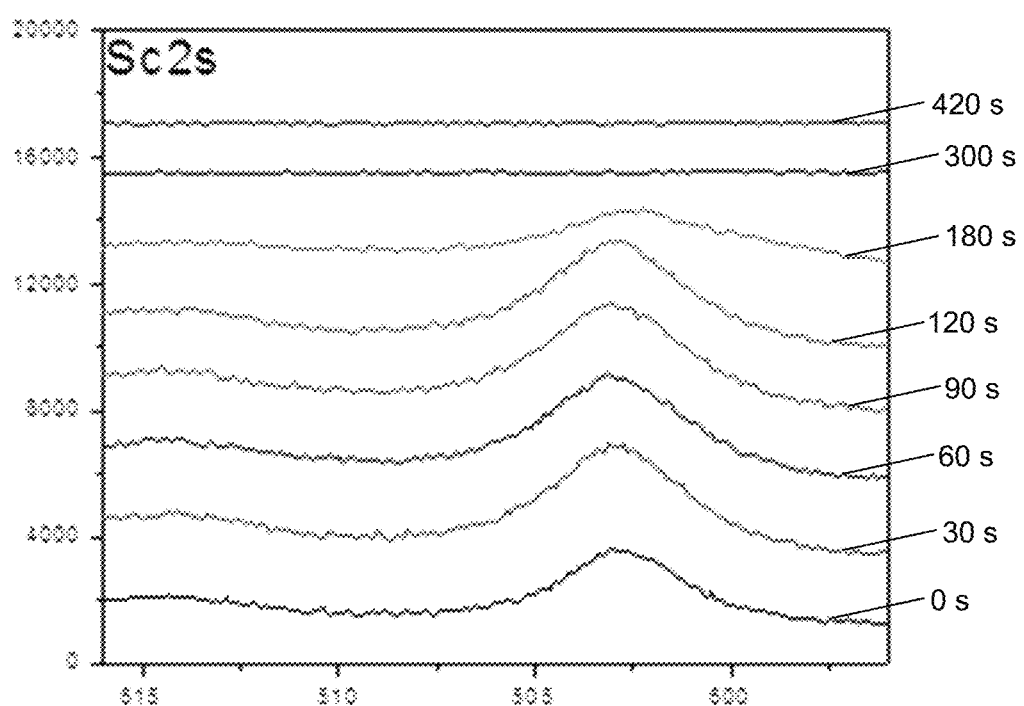
FIG. 11 illustrates XPS analysis of $Sc_2O_3$ films using $Sc(MeCp)_2$(3,5-dimethyl-pyrazolate).
Figure 12:
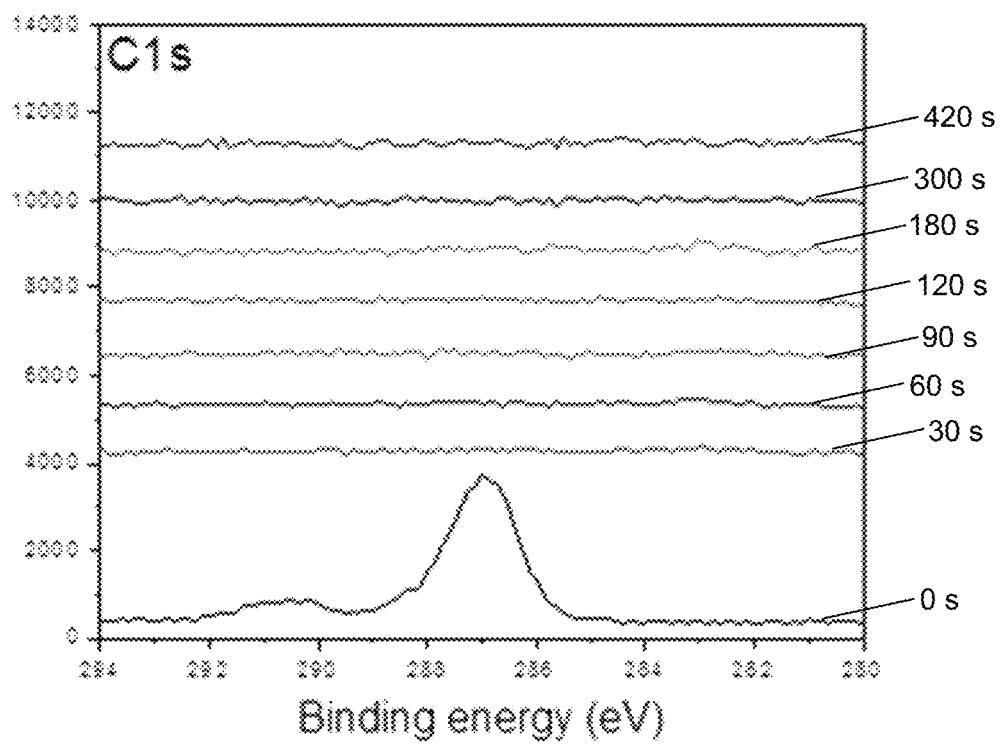
FIG. 12 illustrates XPS analysis of $Sc_2O_3$ films using $Sc(MeCp)_2$(3,5-dimethyl-pyrazolate).
Figure 13:
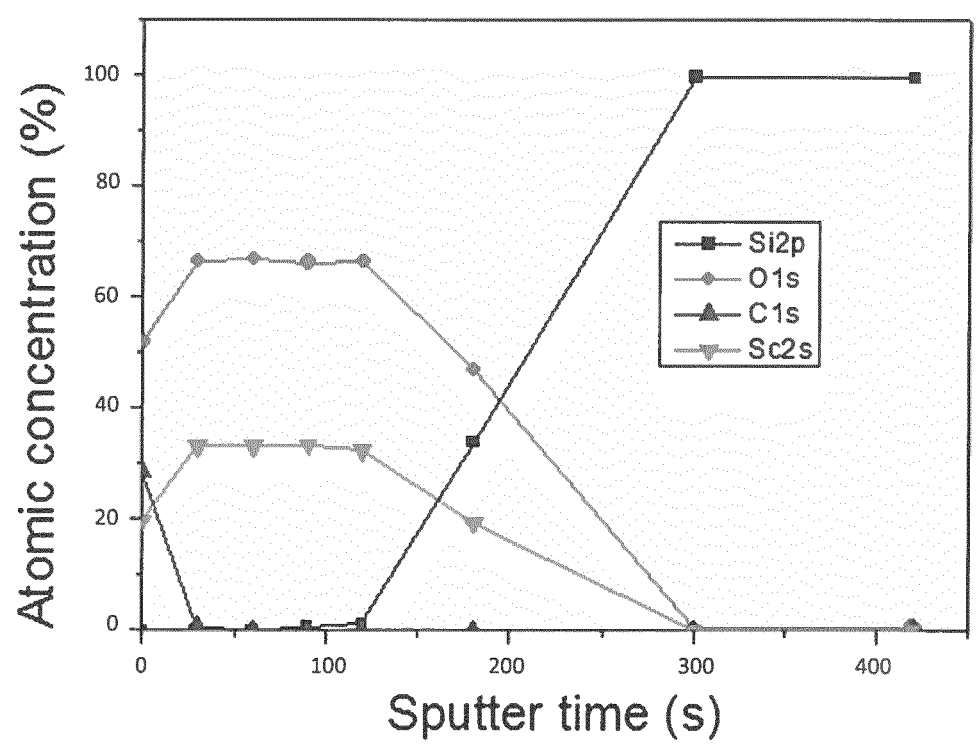
FIG. 13 illustrates XPS analysis of $Sc_2O_3$ films using $Sc(MeCp)_2$(3,5-dimethyl-pyrazolate).
Figure 14:
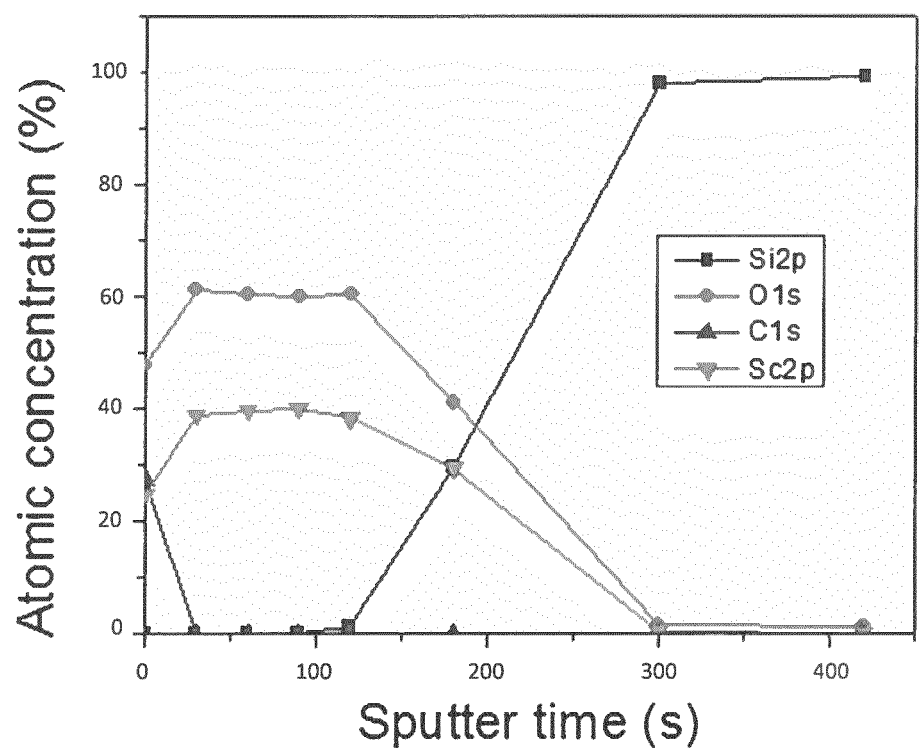
FIG. 14 illustrates XPS analysis of $Sc_2O_3$ films using $Sc(MeCp)_2$(3,5-dimethyl-pyrazolate).

Before describing several exemplary embodiments of the present technology, it is to be understood that the technology is not limited to the details of construction or process steps set forth in the following description. The present technology is capable of other embodiments and of being practiced or being carried out in various ways. It is also to be understood that the metal complexes and other chemical compounds may be illustrated herein using structural formulas which have a particular stereochemistry. These illustrations are intended as examples only and are not to be construed as limiting the disclosed structure to any particular stereochemistry. Rather, the illustrated structures are intended to encompass all such metal complexes and chemical compounds having the indicated chemical formula.

In various aspects, metal complexes, methods of making such metal complexes, and methods of using such metal complexes to form thin metal-containing films via vapor deposition processes, are provided.

As used herein, the terms "metal complex" (or more simply, "complex") and "precursor" are used interchangeably and refer to metal-containing molecule or compound which can be used to prepare a metal-containing film by a vapor deposition process such as, for example, ALD or CVD. The metal complex may be deposited on, adsorbed to, decomposed on, delivered to, and/or passed over a substrate or surface thereof, as to form a metal-containing film. In one or more embodiments, the metal complexes disclosed herein are nickel complexes.

As used herein, the term "metal-containing film" includes not only an elemental metal film as more fully defined below, but also a film which includes a metal along with one or more elements, for example a metal oxide film, metal nitride film, metal silicide film, and the like. As used herein, the terms "elemental metal film" and "pure metal film" are used interchangeably and refer to a film which consists of, or consists essentially of, pure metal. For example, the elemental metal film may include 100% pure metal or the elemental metal film may include at least about 90%, at least about 95%, at least about 96%, at least about 97%, at least about 98%, at least about 99%, at least about 99.9%, or at least about 99.99% pure metal along with one or more impurities. Unless context dictates otherwise, the term "metal film" shall be interpreted to mean an elemental metal film. In some embodiments, the metal-containing film is an elemental scandium or yttrium film. In other embodiments, the metal-containing film is scandium oxide, yttrium oxide, scandium nitride, yttrium nitride, scandium silicide or yttrium silicide film. Such scandium-containing and yttrium-containing films may be prepared from various scandium and yttrium complexes described herein.

As used herein, the term "vapor deposition process" is used to refer to any type of vapor deposition technique, including but not limited to, CVD and ALD. In various embodiments, CVD may take the form of conventional (i.e., continuous flow) CVD, liquid injection CVD, or photo-assisted CVD. CVD may also take the form of a pulsed technique, i.e., pulsed CVD. In other embodiments, ALD may take the form of conventional (i.e., pulsed injection) ALD, liquid injection ALD, photo-assisted ALD, plasma-assisted ALD, or plasma-enhanced ALD. The term "vapor deposition process" further includes various vapor deposition techniques described in *Chemical Vapour Deposition: Precursors, Processes, and Applications*; Jones, A. C.; Hitchman, M. L., Eds. The Royal Society of Chemistry: Cambridge, 2009; Chapter 1, pp 1-36.

The term "alkyl" (alone or in combination with another term(s)) refers to a saturated hydrocarbon chain of 1 to about 12 carbon atoms in length, such as, but not limited to, methyl, ethyl, propyl, butyl, pentyl, hexyl, heptyl, octyl, decyl, and so forth. The alkyl group may be straight-chain or branched-chain. "Alkyl" is intended to embrace all structural isomeric forms of an alkyl group. For example, as used herein, propyl encompasses both n-propyl and isopropyl; butyl encompasses n-butyl, sec-butyl, isobutyl and tert-butyl; pentyl encompasses n-pentyl, tert-pentyl, neopentyl, isopentyl, sec-pentyl and 3-pentyl. Further, as used herein, "Me" refers to methyl, "Et" refers to ethyl, "Pr" refers to propyl, "i-Pr" refers to isopropyl, "Bu" refers to butyl, "t-Bu" refers to tert-butyl, "iBu" refers to isobutyl, "Pn"

refers to and "NPn" refers to neopentyl. In some embodiments, alkyl groups are $C_1$-$C_5$- or $C_1$-$C_4$-alkyl groups.

The term "allyl" refers to an allyl ($C_3H_5$) ligand which is bound to a metal center. As used herein, the allyl ligand has a resonating double bond and all three carbon atoms of the allyl ligand are bound to the metal center in $\eta^3$-coordination by $\pi$ bonding. Therefore, the complexes of the invention are $\pi$ complexes. Both of these features are represented by the dashed bonds. When the allyl portion is substituted by one X group, the $X^1$ group replaces an allylic hydrogen to become [$X^1C_3H_4$]; when substituted with two X groups $X^1$ and $X^2$, it becomes [$X^1X^2C_3H_3$] where $X^1$ and $X^2$ are the same or different, and so forth.

The term "silyl" refers to a —$SiZ^1Z^2Z^3$ radical, where each of $Z^1$, $Z^2$, and $Z^3$ is independently selected from the group consisting of hydrogen and optionally substituted alkyl, alkenyl, alkynyl, aryl, alkoxy, aryloxy, amino, and combinations thereof.

The term "trialkylsilyl" refers to a —$SiZ^4Z^5Z^6$ radical, wherein $Z^5$, $Z^6$, and $Z^7$ are alkyl, and wherein $Z^5$, $Z^6$, and $Z^7$ can be the same or different alkyls. Non-limiting examples of a trialkylsilyl include trimethylsilyl (TMS), triethylsilyl (TES), triisopropylsilyl (TIPS) and tert-butyldimethylsilyl (TBDMS).

Deposition of some metals, including scandium and yttrium, can be difficult to achieve due to thermal stability issues, being either unstable or too stable for deposition. The organometallic complexes disclosed in the embodiments of the invention allow for control of physical properties as well as provide for increased stability and simple high yield synthesis. In this regard, the metal complexes provided herein are excellent candidates for preparation of thin metal-containing films in various vapor deposition processes.

Therefore, according to one aspect, a metal complex of Formula I is provided: [$(R^1)_nCp]_2M^1L^1$ (I), wherein $M^1$ is a Group 3 metal or a lanthanide; each $R^1$ is independently hydrogen, $C_1$-$C_5$-alkyl or silyl; n is 1, 2, 3, 4, or 5; Cp is cyclopentadienyl ring; and $L^1$ is selected from the group consisting of: $NR^2R^3$; $N(SiR^4R^5R^6)_2$; $3,5$-$R^7R^8$—$C_3HN_2$; $1$-$(R^{32})C_3H_4$; $1$-$R^{33}$-$3$-$R^{34}$—$C_3H_3$; $R^{35}$, $R^{36}$—$C_3HO_2$; $R^{12}N=C-C-NR^{13}$; $R^{14}R^{15}N-CH_2-CH_2-NR^{16}-CH_2-CH_2-NR^{17}R^{18}$; and $R^{19}O-CH_2-CH_2-NR^{20}-CH_2-CH_2-OR^{21}$; wherein $R^2$, $R^3$, $R^4$, $R^5$, $R^6$, $R^7$, $R^8$, $R^{12}$, $R^{13}$, $R^{14}$, $R^{15}$, $R^{16}$, $R^{17}$, $R^{18}$, $R^{19}$, $R^{20}$, and $R^{21}$ are each independently hydrogen or $C_1$-$C_5$-alkyl and $R^{32}$, $R^{33}$, $R^{34}$, $R^{35}$, and $R^{36}$ are each independently alkyl or silyl.

In some embodiments, $M^1$ may be selected from the group consisting of scandium, yttrium and lanthanum. In other embodiments, $M^1$ may be selected from the group consisting of scandium and yttrium. In particular, $M^1$ may be scandium.

In other embodiments, when $M^1$ is yttrium and $L^1$ is $3,5$-$R^7R^8$—$C_3HN_2$, $R^1$ is $C_1$-$C_5$-alkyl or silyl and/or wherein when $M^1$ is yttrium and $L^1$ is $N(SiR^4R^5R^6)_2$, n is 1, 2, 3, or 4.

In some embodiments, $L^1$ is selected from the group consisting of: $NR^2R^3$; $N(SiR^4R^5R^6)_2$; $3,5$-$R^7R^8$—$C_3HN_2$; $1$-$(R^{32})C_3H_4$; $1$-$R^{33}$-$3$-$R^{34}$—$C_3H_3$, and $R^{35}$, $R^{36}$—$C_3HO_2$.

In some embodiments, $L^1$ is selected from the group consisting of: $NR^2R^3$; $N(SiR^4R^5R^6)_2$; $3,5$-$R^7R^8$—$C_3HN_2$; $1$-$(SiMe_3)C_3H_4$(trimethyl silylallyl); $1,3$-bis-$(SiMe_3)_2C_3H_3$ (bis-trimethyl silylallyl), 6-methyl-2,4-heptanedionate.

$R^1$, at each occurrence, can be the same or different. For example, if n is 2, 3, 4, or 5, each $R^1$ may all be hydrogen or all be an alkyl (e.g., $C_1$-$C_5$-alkyl) or all be silyl. Alternatively, if n is 2, 3, 4, or 5, each $R^1$ may be different. For example if n is 2, a first $R^1$ may be hydrogen and a second $R^1$ may be an alkyl (e.g., $C_1$-$C_5$-alkyl) or silyl.

$R^2$, $R^3$, $R^4$, $R^5$, $R^6$, $R^7$, $R^8$, $R^{12}$, $R^{13}$, $R^{14}$, $R^{15}$, $R^{16}$, $R^{17}$, $R^{18}$, $R^{19}$, $R^{20}$, and $R^{21}$ at each occurrence, can be the same or different. For example, $R^2$, $R^3$, $R^4$, $R^5$, $R^6$, $R^7$, $R^8$, $R^{12}$, $R^{13}$, $R^{14}$, $R^{15}$, $R^{16}$, $R^{17}$, $R^{18}$, $R^{19}$, $R^{20}$, and $R^{21}$ may all be hydrogen or all be an alkyl (e.g., $C_1$-$C_5$-alkyl).

In one embodiment, up to and including sixteen of $R^2$, $R^3$, $R^4$, $R^5$, $R^6$, $R^7$, $R^8$, $R^{12}$, $R^{13}$, $R^{14}$, $R^{15}$, $R^{16}$, $R^{17}$, $R^{18}$, $R^{19}$, $R^{20}$, and $R^{21}$ may each be hydrogen. For example, at least one of, at least two of, at least three of, at least four of or at least five of, at least six of, at least seven of, at least eight of, at least nine of, at least ten of, at least eleven of, at least twelve of, at least thirteen of, at least fourteen of, at least fifteen of, or at least sixteen of $R^2$, $R^3$, $R^4$, $R^5$, $R^6$, $R^7$, $R^8$, $R^{12}$, $R^{13}$, $R^{14}$, $R^{15}$, $R^{16}$, $R^1$, $R^{18}$, $R^{19}$, $R^{20}$, and $R^{21}$ may be hydrogen.

In another embodiment, up to and including sixteen of $R^2$, $R^3$, $R^4$, $R^5$, $R^6$, $R^7$, $R^8$, $R^{12}$, $R^{13}$, $R^{14}$, $R^{15}$, $R^{16}$, $R^{17}$, $R^{18}$, $R^{19}$, $R^{20}$, and $R^{21}$ each independently may be an alkyl. For example, at least one of, at least two of, at least three of, at least four of or at least five of, at least six of, at least seven of, at least eight of, at least nine of, at least ten of, at least eleven of, at least twelve of, at least thirteen of, at least fourteen of, at least fifteen of, or at least sixteen of $R^2$, $R^3$, $R^4$, $R^5$, $R^6$, $R^7$, $R^8$, $R^{12}$, $R^{13}$, $R^{14}$, $R^{15}$, $R^{16}$, $R^{17}$, $R^{18}$, $R^{19}$, $R^{20}$, and $R^{21}$ may be an alkyl.

$R^{32}$, $R^{33}$, and $R^{34}$ at each occurrence, can be the same or different. For example, $R^{32}$, $R^{33}$, and $R^{34}$ may all be an alkyl (e.g., $C_1$-$C_5$-alkyl) or may all be silyl (e.g., $SiMe_3$).

$R^{35}$ and $R^{36}$ at each occurrence, can be the same or different. For example, $R^{35}$ and $R^{36}$ may all be the same or different alkyl (e.g., $C_1$-$C_5$-alkyl), $R^{35}$ and $R^{36}$ may all be the same or different silyl (e.g., $SiMe_3$) or $R^{35}$ and $R^{36}$ may be an alkyl (e.g., $C_1$-$C_5$-alkyl) and a silyl (e.g., $SiMe_3$).

In one embodiment, up to and including two of $R^{32}$, $R^{33}$, $R^{34}$, $R^{35}$, and $R^{36}$ each independently may be alkyl. For example, at least one of or at least two of $R^{32}$, $R^{33}$, $R^{34}$, $R^{35}$, and $R^{36}$ may be an alkyl.

In another embodiment, up to and including two of $R^{32}$, $R^{33}$, $R^{34}$, $R^{35}$, and $R^{36}$ each independently may be silyl. For example, at least one of or at least two of $R^{32}$, $R^{33}$, $R^{34}$, $R^{35}$, and $R^{36}$ may be an silyl.

The alkyl groups discussed herein can be $C_1$-$C_5$-alkyl, $C_1$-$C_7$-alkyl, $C_1$-$C_6$-alkyl, $C_1$-$C_5$-alkyl, $C_1$-$C_4$-alkyl, $C_1$-$C_3$-alkyl, $C_1$-$C_2$-alkyl or $C_1$-alkyl. In a further embodiment, the alkyl is $C_1$-$C_5$-alkyl, $C_1$-$C_4$-alkyl, $C_1$-$C_3$-alkyl, $C_1$-$C_2$-alkyl or $C_1$-alkyl. The alkyl group may be straight-chained or branch. In particular, the alkyl is straight-chained. In a further embodiment the alkyl is selected from the group consisting of methyl, ethyl, propyl, isopropyl, butyl, isobutyl, sec-butyl, tert-butyl, pentyl, and neopentyl.

The silyl group discussed herein can be, but is not limited to $Si(alkyl)_3$, $Si(alkyl)_2H$, and $Si(alkyl)H_2$, wherein the alkyl is as described above. Examples of the silyl include, but are not limited to $SiH_3$, $SiMeH_2$, $SiMe_2H$, $SiMe_3$, $SiEtH_2$, $SiEt_2H$, $SiEt_3$, $SiPrH_2$, $SiPr_2H$, $SiPr_3$, $SiBuH_2$, $SiBu_2H$, $SiBu_3$, where "Pr" includes i-Pr and "Bu" includes t-Bu.

In some embodiments, each $R^1$ independently may be hydrogen, $C_1$-$C_4$-alkyl or silyl. In another embodiment, each $R^1$ independently may be hydrogen, methyl, ethyl, propyl or silyl. In another embodiment, each $R^1$ independently may be hydrogen, methyl, or ethyl. In particular, each $R^1$ may be methyl.

In some embodiments, $R^2$, $R^3$, $R^4$, $R^5$, $R^6$, $R^7$, $R^8$, $R^{12}$, $R^{13}$, $R^{14}$, $R^{15}$, $R^{16}$, $R^{17}$, $R^{18}$, $R^{19}$, $R^{20}$, and $R^{21}$ each independently may be hydrogen or $C_1$-$C_4$-alkyl. In other embodiments, $R^2$, $R^3$, $R^4$, $R^5$, $R^6$, $R^7$, $R^8$, $R^{12}$, $R^{13}$, $R^{14}$, $R^{15}$, $R^{16}$, $R^{17}$, $R^{18}$, $R^{19}$, $R^{20}$, and $R^{21}$ each independently may be hydrogen, methyl, ethyl or propyl. In other embodiments, $R^2$, $R^3$, $R^4$, $R^5$, $R^6$, $R^7$, $R^8$, $R^{12}$, $R^{13}$, $R^{14}$, $R^{15}$, $R^{16}$, $R^{17}$, $R^{18}$, $R^{19}$, $R^{20}$, and $R^{21}$ each independently may be hydrogen, methyl, or ethyl. In particular, $R^2$, $R^3$, $R^4$, $R^5$, $R^6$, $R^7$, $R^8$, $R^{12}$, $R^{13}$, $R^{14}$, $R^{15}$, $R^{16}$, $R^{17}$, $R^{18}$, $R^{19}$, $R^{20}$, and $R^{21}$ each independently may be hydrogen or methyl.

In some embodiments, each $R^1$ independently may be hydrogen, $C_1$-$C_4$-alkyl or silyl; and $R^2$, $R^3$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, and $R^{18}$ each independently may be hydrogen or $C_1$-$C_4$-alkyl.

In other embodiments, each $R^1$ independently may be hydrogen, methyl, ethyl, propyl or silyl; and $R^2$, $R^3$, $R^4$, $R^5$, $R^6$, $R^7$, $R^8$, $R^{12}$, $R^{13}$, $R^{14}$, $R^{15}$, $R^{16}$, $R^{17}$, $R^{18}$, $R^{19}$, $R^{20}$, and $R^{21}$ each independently may be hydrogen, methyl, ethyl or propyl.

In some embodiments, each $R^1$ independently may be hydrogen, methyl, or ethyl; and $R^2$, $R^3$, $R^4$, $R^5$, $R^6$, $R^7$, $R^8$, $R^{12}$, $R^{13}$, $R^{14}$, $R^{15}$, $R^{16}$, $R^{17}$, $R^{18}$, $R^{19}$, $R^{20}$, and $R^{21}$ each independently may be hydrogen, methyl, or ethyl. In another embodiment, each $R^1$ may be methyl and $R^2$, $R^3$, $R^4$, $R^5$, $R^6$, $R^7$, $R^8$, $R^{12}$, $R^{13}$, $R^{14}$, $R^{15}$, $R^{16}$, $R^{17}$, $R^{18}$, $R^{19}$, $R^{20}$, and $R^{21}$ each independently may be hydrogen or methyl.

In some embodiments, $R^{32}$, $R^{33}$, $R^{34}$, $R^{35}$, and $R^{36}$ each independently may be $C_1$-$C_5$-alkyl or silyl. In other embodiments, $R^{32}$, $R^{33}$, $R^{34}$, $R^{35}$, and $R^{36}$ each independently may be $C_1$-$C_4$-alkyl or silyl. In other embodiments, $R^{32}$, $R^{33}$, $R^{34}$, $R^{35}$, and $R^{36}$ each independently may be methyl, ethyl, propyl or silyl. In other embodiments, $R^{32}$, $R^{33}$, $R^{34}$, $R^{35}$, and $R^{36}$ each independently may be methyl, ethyl or silyl. In other embodiments, $R^{32}$, $R^{33}$, $R^{34}$, $R^{35}$, and $R^{36}$ each independently may silyl, such as but not limited to, $SiH_3$, $SiMeH_2$, $SiMe_2H$, $SiMe_3$, $SiEtH_2$, $SiEt_2H$, $SiEt_3$, $SiPrH_2$, $SiPr_2H$, $SiPr_3$, $SiBuH_2$, $SiBu_2H$, $SiBu_3$. In particular, $R^{32}$, $R^{33}$, $R^{34}$, $R^{35}$, and $R^{36}$ each independently may be $SiMe_3$. In particular, $R^{32}$, $R^{33}$, and $R^{34}$, each independently may be $SiMe_3$. In other embodiments, $R^{35}$ and $R^{36}$ may each independently be $C_1$-$C_4$-alkyl, particularly methyl and/or butyl.

In some embodiments, $L^1$ is selected from the group consisting of: $NR^2R^3$; $N(SiR^4R^5R^6)_2$; 1-($R^{32}$)$C_3H_4$; and 1-$R^{33}$-3-$R^{34}$—$C_3H_3$.

In another embodiment, $L^1$ may be selected from the group consisting of: $NR^2R^3$; $N(SiR^4R^5R^6)_2$; 1-$(SiMe_3)$$C_3H_4$; 1,3-bis-$(SiMe_3)_2C_3H_3$; and $R^{35}$, $R^{36}$—$C_3HO_2$.

In another embodiment, each $R^1$ independently may be hydrogen, $C_1$-$C_4$-alkyl or silyl; and $L^1$ is $NR^2R^3$, wherein $R^2$ and $R^3$ each independently may be hydrogen or $C_1$-$C_4$-alkyl. In another embodiment, each $R^1$ independently may be hydrogen, methyl, ethyl, propyl or silyl; and $R^2$ and $R^3$ each independently may be hydrogen, methyl, ethyl or propyl. In another embodiment, each $R^1$ independently may be hydrogen, methyl, or ethyl; and $R^2$ and $R^3$ each independently may be hydrogen, methyl, or ethyl. In particular, each $R^1$ may be methyl; and $R^2$ and $R^3$ each independently may be hydrogen, methyl, or ethyl.

In another embodiment, each $R^1$ independently may be hydrogen, $C_1$-$C_4$-alkyl or silyl; and $L^1$ is $N(SiR^4R^5R^6)_2$, wherein $R^4$, $R^5$, and $R^6$ each independently may be hydrogen or $C_1$-$C_4$-alkyl. In another embodiment, each $R^1$ independently may be hydrogen, methyl, ethyl, propyl or silyl; and $R^4$, $R^5$, and $R^6$ each independently may be hydrogen, methyl, ethyl or propyl. In another embodiment, each $R^1$ independently may be hydrogen, methyl, or ethyl; and $R^4$, $R^5$, and $R^6$ each independently may be hydrogen, methyl, or ethyl. In particular, each $R^1$ may be methyl; and $R^4$, $R^5$, and $R^6$ each independently may be hydrogen, methyl, or ethyl.

In some embodiments, each $R^1$ independently may be hydrogen, $C_1$-$C_4$-alkyl or silyl; and $L^1$ may be 3,5-$R^7R^8$—$C_3HN_2$, wherein $R^7$ and $R^8$ each independently may be hydrogen or $C_1$-$C_5$-alkyl. In other embodiments, each $R^1$ independently may be hydrogen, methyl, ethyl, propyl or silyl. In other embodiments, each $R^1$ independently may be hydrogen, methyl, or ethyl. In particular, each $R^1$ may be methyl. In other embodiments, $R^7$ and $R^8$ each independently may be hydrogen or $C_1$-$C_4$-alkyl or hydrogen. In other embodiments, $R^7$ and $R^8$ each independently may be methyl, ethyl, propyl or hydrogen. In particular, $R^7$ and $R^8$ each independently may be methyl or ethyl.

In some embodiments, each $R^1$ independently may be hydrogen, $C_1$-$C_4$-alkyl or silyl; and $L^1$ may be 1-($R^{32}$)$C_3H_4$, wherein $R^{32}$ may be $C_1$-$C_5$-alkyl or silyl. In another embodiment, $R^{32}$ may be $C_1$-$C_4$-alkyl or silyl. In other embodiments, each $R^1$ independently may be hydrogen, methyl, ethyl or silyl and $R^{32}$ may be silyl. In another embodiment, each $R^1$ independently may be hydrogen, methyl or ethyl and $R^{32}$ may be a silyl, such as but not limited to, $SiH_3$, $SiMeH_2$, $SiMe_2H$, $SiMe_3$, $SiEtH_2$, $SiEt_2H$, $SiEt_3$, $SiPrH_2$, $SiPr_2H$, $SiPr_3$, $SiBuH_2$, $SiBu_2H$, $SiBu_3$. In particular, each $R^1$ independently may be methyl or ethyl and $R^{32}$ may be $SiMe_3$.

In other embodiments, each $R^1$ independently may be hydrogen, $C_1$-$C_4$-alkyl or silyl; and $L^1$ may be 1-$R^{33}$-3-$R^{34}$—$C_3H_3$, wherein $R^{33}$ and $R^{34}$ may be $C_1$-$C_5$-alkyl or silyl. In another embodiment, each $R^1$ independently may be hydrogen, methyl, ethyl or silyl and $R^{33}$ and $R^{34}$ may each independently be $C_1$-$C_4$-alkyl or silyl and $R^{32}$ may be silyl. In another embodiment, each $R^1$ independently may be hydrogen, methyl or ethyl and $R^{33}$ and $R^{34}$ may each independently be a silyl, such as but not limited to, $SiH_3$, $SiMeH_2$, $SiMe_2H$, $SiMe_3$, $SiEtH_2$, $SiEt_2H$, $SiEt_3$, $SiPrH_2$, $SiPr_2H$, $SiPr_3$, $SiBuH_2$, $SiBu_2H$, $SiBu_3$. In particular, each $R^1$ independently may be methyl or ethyl and $R^{33}$ and $R^{34}$ may be $SiMe_3$.

In other embodiments, each $R^1$ independently may be hydrogen, $C_1$-$C_4$-alkyl or silyl; and $L^1$ may be $R^{35}$, $R^{36}$—$C_3HO_2$, wherein $R^{35}$ and $R^{36}$ may be $C_1$-$C_5$-alkyl or silyl. In another embodiment, each $R^1$ independently may be hydrogen, methyl, ethyl or silyl and $R^{35}$ and $R^{36}$ may each independently be $C_1$-$C_4$-alkyl or silyl. In another embodiment, each $R^1$ independently may be hydrogen, methyl or ethyl and $R^{35}$ and $R^{36}$ may each independently be a silyl, such as but not limited to, $SiH_3$, $SiMeH_2$, $SiMe_2H$, $SiMe_3$, $SiEtH_2$, $SiEt_2H$, $SiEt_3$, $SiPrH_2$, $SiPr_2H$, $SiPr_3$, $SiBuH_2$, $SiBu_2H$, $SiBu_3$. In another embodiment, each $R^1$ independently may be hydrogen, methyl or ethyl and $R^{35}$ and $R^{36}$ may each independently be $C_1$-$C_4$-alkyl, particularly methyl and/or butyl. In particular, each $R^1$ independently may be methyl or ethyl and $R^{35}$ and $R^{36}$ may independently each be methyl or butyl. In particular, each $R^1$ independently may be methyl or ethyl and $R^{35}$ and $R^{36}$ may be $SiMe_3$.

Examples of metal complexes corresponding in structure to Formula I are provided in Table 1.

TABLE 1

| Complexes of Formula I | |
|---|---|
| $Sc(MeCp)_2[1-(SiMe_3)C_3H_4]$ | (1) |
| $Sc(MeCp)_2[1,3\text{-bis-}(SiMe_3)_2C_3H_3]$ | (2) |
| $Sc(MeCp)_2[N(SiMe_3)_2]$ | (3) |
| $Sc(MeCp)_2(3,5\text{-}Me_2\text{-}C_3HN_2)$ | (4) |

TABLE 1-continued

Complexes of Formula I (5) [Structure: H3C-Cp-Sc-Cp-H3C with N=C(N-)(N-) guanidinate ligand]

(6) [Structure: H3C-Cp-Sc-Cp-H3C with O-CH2-CH2-N(-)-CH2-CH2-O chelate]

(7) [Structure: H3C-Cp-Sc-Cp-H3C with N-CH2-CH2-N(-)-CH2-CH2-N chelate]

(8) Y(MeCp)$_2$(3,5-MePn-C$_3$HN$_2$)

(9) [Structure: H3C-Cp-Sc-Cp-H3C with Me-C(O)=CH-C(O)-iBu β-diketonate]

(10) [Structure: H3C-Cp-Y-Cp-H3C with Me-C(O)=CH-C(O)-iBu β-diketonate]

In one embodiment, a mixture of two or more organometallic complexes of Formula I is provided.

In another embodiment, a metal complex of Formula II is provided: [((R$^9$)$_n$Cp)$_2$M$^2$L$^2$]$_2$ (II), wherein M$^2$ is a Group 3 metal or a lanthanide; each R$^9$ is independently hydrogen or C$_1$-C$_5$-alkyl; n is 1, 2, 3, 4 or 5; Cp is cyclopentadienyl ring; and L$^2$ is selected from the group consisting of: Cl; F; Br; I; 3,5-R$^{10}$R$^{11}$—C$_3$HN$_2$; R$^{22}$N═C—C—NR$^{23}$; R$^{24}$R$^{25}$N—CH$_2$—NR$^{26}$—CH$_2$—NR$^{27}$R$^{28}$, and R$^{29}$O—CH$_2$—NR$^{30}$—CH$_2$—OR$^{31}$; wherein R$^1$, R$^{11}$, R$^{22}$, R$^{23}$, R$^{24}$, R$^{25}$, R$^{26}$, R$^{27}$, R$^{28}$, R$^{29}$, R$^{30}$, and R$^{31}$ are each independently hydrogen or C$_1$-C$_5$-alkyl.

In some embodiments, M$^2$ may be selected from the group consisting of scandium, yttrium and lanthanum. In other embodiments, M$^2$ may be selected from the group consisting of scandium and yttrium. In particular, M$^2$ may be scandium.

In other embodiments, wherein when M$^2$ is scandium and L$^2$ is Cl, R$^9$ is C$_1$-C$_5$-alkyl.

In some embodiments, L$^2$ is selected from the group consisting of: Cl; F; Br; I; and 3,5-R$^{10}$R$^{11}$—C$_3$HN$_2$ R$^9$, at each occurrence, can be the same or different. For example, if n is 2, 3, 4, or 5, each R$^9$ may all be hydrogen or all be an alkyl (e.g., C$_1$-C$_5$-alkyl). Alternatively, if n is 2, 3, 4, or 5, each R$^1$ may be different. For example if n is 2, a first R$^9$ may be hydrogen and a second R$^9$ may be an alkyl (e.g., C$_1$-C$_5$-alkyl).

R$^{10}$, R$^{11}$, R$^{22}$, R$^{23}$, R$^{24}$, R$^{25}$, R$^{26}$, R$^{27}$, R$^{28}$, R$^{29}$, R$^{30}$, and R$^{31}$, at each occurrence, can be the same or different. For example, R$^{10}$, R$^{11}$, R$^{22}$, R$^{23}$, R$^{24}$, R$^{25}$, R$^{26}$, R$^{27}$, R$^{28}$, R$^{29}$, R$^{30}$, and R$^{31}$ may all be hydrogen or all be an alkyl (e.g., C$_1$-C$_5$-alkyl).

In one embodiment, up to and including eleven of R$^{10}$, R$^{11}$, R$^{22}$, R$^{23}$, R$^{24}$, R$^{25}$, R$^{26}$, R$^{27}$, R$^{28}$, R$^{29}$, R$^{30}$, and R$^{31}$ may each be hydrogen. For example, at least one of, at least two of, at least three of, at least four of or at least five of, at least six of, at least seven of, at least eight of, at least nine of, at least ten of, at least eleven of R$^{10}$, R$^{11}$, R$^{22}$, R$^{23}$, R$^{24}$, R$^{25}$, R$^{26}$, R$^{27}$, R$^{28}$, R$^{29}$, R$^{30}$, and R$^{31}$ may be hydrogen.

In another embodiment, up to and including eleven of R$^{10}$, R$^{11}$, R$^{22}$, R$^{23}$, R$^{24}$, R$^{25}$, R$^{26}$, R$^{27}$, R$^{28}$, R$^{29}$, R$^{30}$, and R$^{31}$ each independently may be an alkyl. For example, at least one of, at least two of, at least three of, at least four of or at least five of, at least six of, at least seven of, at least eight of, at least nine of, at least ten of, at least eleven of R$^{10}$, R$^{11}$, R$^{22}$, R$^{23}$, R$^{24}$, R$^{25}$, R$^{26}$, R$^{27}$, R$^{28}$, R$^{29}$, R$^{30}$, and R$^{31}$ may be an alkyl.

The alkyl groups discussed herein can be C$_1$-C$_5$-alkyl, C$_1$-C$_7$-alkyl, C$_1$-C$_6$-alkyl, C$_1$-C$_5$-alkyl, C$_1$-C$_4$-alkyl, C$_1$-C$_3$-alkyl, C$_1$-C$_2$-alkyl or C$_1$-alkyl. In a further embodiment, the alkyl is C$_1$-C$_5$-alkyl, C$_1$-C$_4$-alkyl, C$_1$-C$_3$-alkyl, C$_1$-C$_2$-alkyl or C$_1$-alkyl. The alkyl group may be straight-chained or branch. In particular, the alkyl is straight-chained. In a further embodiment the alkyl is selected from the group consisting of methyl, ethyl, propyl, isopropyl, butyl, isobutyl, sec-butyl, tert-butyl, pentyl, and neopentyl.

In some embodiments, each R$^9$ independently may be C$_1$-C$_5$-alkyl. In other embodiments, each R$^9$ independently may be hydrogen or C$_1$-C$_4$-alkyl. In another embodiment, each R$^9$ independently may be hydrogen, methyl, ethyl, or propyl. In another embodiment, each R$^9$ independently may be hydrogen, methyl, or ethyl. In particular, each R$^9$ may be methyl.

In a particular embodiment, M$^2$ may be scandium and each R$^9$ independently may be a C$_1$-C$_4$-alkyl. In another embodiment, M$^2$ may be scandium, L$^2$ may be Cl and each R$^9$ independently may be methyl, ethyl or propyl. In particular, each R$^9$ may independently be methyl or ethyl.

In another particular embodiment, M$^2$ may be yttrium and each R$^9$ independently may be a C$_1$-C$_4$-alkyl. In another embodiment, M$^2$ may be yttrium, L$^2$ may be 3,5-R$^{10}$R$^{11}$—C$_3$HN$_2$, each R$^9$ independently may be methyl, ethyl or propyl and R$^{10}$ and R$^9$ each independently may be a C$_1$-C$_5$-alkyl. In particular, each R$^9$ independently may be methyl or ethyl.

Examples of metal complexes corresponding in structure to Formula II are provided in Table 2.

TABLE 2

| Complexes of Formula II | |
|---|---|
| [Sc(MeCp)$_2$]Cl]$_2$ (11) | [Y(MeCp)$_2$(3,5-MePn-C$_3$HN$_2$)]$_2$ (12) |

Additional other metal complexes provided herein include Y(MeCp)$_2$(3,5-tBu$_2$—C$_3$HN$_2$)(THF), Y(MeCp)$_2$(3,5-MePn—C$_3$HN$_2$)(THF), and Y(MeCp)$_2$(3,5-tBu, iBu-C$_3$HN$_2$)(THF). As used herein, "THF" refers to tetrahydrofuran The metal complexes provided herein may be prepared, for example, as shown below in Scheme A.

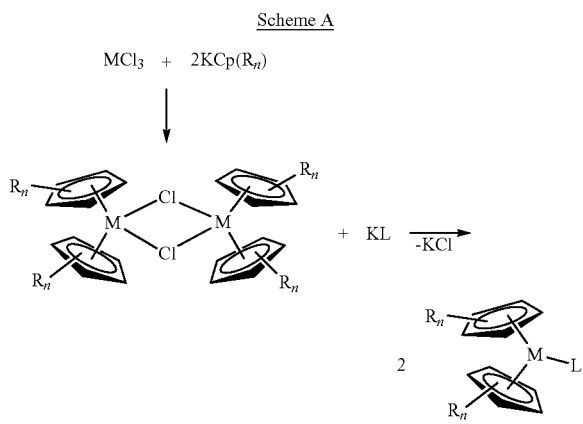

Scheme A

The metal complexes provided herein may be used to prepare metal-containing films such as, for example, elemental scandium, elemental yttrium, scandium oxide, yttrium oxide, scandium nitride, yttrium nitride and scandium silicide and yttrium silicide films. Thus, according to another aspect, a method of forming a metal-containing film by a vapor deposition process is provided. The method comprises vaporizing at least one organometallic complex corresponding in structure to Formula I, Formula II, or a combination thereof, as disclosed herein. For example, this may include (1) vaporizing the at least one complex and (2) delivering the at least one complex to a substrate surface or passing the at least one complex over a substrate (and/or decomposing the at least one complex on the substrate surface).

A variety of substrates can be used in the deposition methods disclosed herein. For example, metal complexes as disclosed herein may be delivered to, passed over, or deposited on a variety of substrates or surfaces thereof such as, but not limited to, silicon, crystalline silicon, Si(100), Si(111), silicon oxide, glass, strained silicon, silicon on insulator (SOI), doped silicon or silicon oxide(s) (e.g., carbon doped silicon oxides), silicon nitride, germanium, gallium arsenide, tantalum, tantalum nitride, aluminum, copper, ruthenium, titanium, titanium nitride, tungsten, tungsten nitride, and any number of other substrates commonly encountered in nanoscale device fabrication processes (e.g., semiconductor fabrication processes). As will be appreciated by those of skill in the art, substrates may be exposed to a pretreatment process to polish, etch, reduce, oxidize, hydroxylate, anneal and/or bake the substrate surface. In one or more embodiments, the substrate surface contains a hydrogen-terminated surface.

In certain embodiments, the metal complex may be dissolved in a suitable solvent such as a hydrocarbon or an amine solvent to facilitate the vapor deposition process. Appropriate hydrocarbon solvents include, but are not limited to, aliphatic hydrocarbons, such as hexane, heptane and nonane; aromatic hydrocarbons, such as toluene and xylene; and aliphatic and cyclic ethers, such as diglyme, triglyme, and tetraglyme. Examples of appropriate amine solvents include, without limitation, octylamine and N,N-dimethyldodecylamine. For example, the metal complex may be dissolved in toluene to yield a solution with a concentration from about 0.05 M to about 1 M.

In another embodiment, the at least one metal complex may be delivered "neat" (undiluted by a carrier gas) to a substrate surface.

In one embodiment, the vapor deposition process is chemical vapor deposition.

In another embodiment, the vapor deposition process is atomic layer deposition.

The ALD and CVD methods encompass various types of ALD and CVD processes such as, but not limited to, continuous or pulsed injection processes, liquid injection processes, photo-assisted processes, plasma-assisted, and plasma-enhanced processes. For purposes of clarity, the methods of the present technology specifically include direct liquid injection processes. For example, in direct liquid injection CVD ("DLI-CVD"), a solid or liquid metal complex may be dissolved in a suitable solvent and the solution formed therefrom injected into a vaporization chamber as a means to vaporize the metal complex. The vaporized metal complex is then transported/delivered to the substrate surface. In general, DLI-CVD may be particularly useful in those instances where a metal complex displays relatively low volatility or is otherwise difficult to vaporize.

In one embodiment, conventional or pulsed CVD is used to form a metal-containing film vaporizing and/or passing the at least one metal complex over a substrate surface. For conventional CVD processes see, for example Smith, Donald (1995). *Thin-Film Deposition: Principles and Practice*. McGraw-Hill.

In one embodiment, CVD growth conditions for the metal complexes disclosed herein include, but are not limited to:
 a. Substrate temperature: 50-600° C.
 b. Evaporator temperature (metal precursor temperature): 0-200° C.
 c. Reactor pressure: 0-100 Torr
 d. Argon or nitrogen carrier gas flow rate: 0-500 sccm
 e. Oxygen flow rate: 0-500 sccm
 f. Hydrogen flow rate: 0-500 sccm
 g. Run time: will vary according to desired film thickness In another embodiment, photo-assisted CVD is used to form a metal-containing film by vaporizing and/or passing at least one metal complex disclosed herein over a substrate surface.

In a further embodiment, conventional (i.e., pulsed injection) ALD is used to form a metal-containing film by vaporizing and/or passing at least one metal complex disclosed herein over a substrate surface. For conventional ALD processes see, for example, George S. M., et al. *J. Phys. Chem.*, 1996, 100, 13121-13131.

In another embodiment, liquid injection ALD is used to form a metal-containing film by vaporizing and/or passing at least one metal complex disclosed herein over a substrate surface, wherein at least one metal complex is delivered to the reaction chamber by direct liquid injection as opposed to vapor draw by a bubbler. For liquid injection ALD processes see, for example, Potter R. J., et al., *Chem. Vap. Deposition*, 2005, 11(3), 159-169.

Examples of ALD growth conditions for metal complexes disclosed herein include, but are not limited to:
 a. Substrate temperature: 0-400° C.
 b. Evaporator temperature (metal precursor temperature): 0-200° C.
 c. Reactor pressure: 0-100 Torr
 d. Argon or nitrogen carrier gas flow rate: 0-500 sccm
 e. Reactive gas flow rate: 0-500 sccm
 f. Pulse sequence (metal complex/purge/reactive gas/purge): will vary according to chamber size g. Number of cycles: will vary according to desired film thickness In another embodiment, photo-assisted ALD is used to form a metal-containing film by vaporizing and/or passing at least one metal complex disclosed herein over a substrate surface. For photo-assisted ALD processes see, for example, U.S. Pat. No. 4,581,249.

In another embodiment, plasma-assisted or plasma-enhanced ALD is used to form a metal-containing film by vaporizing and/or passing at least one metal complex disclosed herein over a substrate surface.

In another embodiment, a method of forming a metal-containing film on a substrate surface comprises: during an ALD process, exposing a substrate to a vapor phase metal complex according to one or more of the embodiments described herein, such that a layer is formed on the surface comprising the metal complex bound to the surface by the metal center (e.g., nickel); during an ALD process, exposing the substrate having bound metal complex with a co-reactant such that an exchange reaction occurs between the bound metal complex and co-reactant, thereby dissociating the bound metal complex and producing a first layer of elemental metal on the surface of the substrate; and sequentially repeating the ALD process and the treatment.

The reaction time, temperature and pressure are selected to create a metal-surface interaction and achieve a layer on the surface of the substrate. The reaction conditions for the ALD reaction will be selected based on the properties of the metal complex. The deposition can be carried out at atmospheric pressure but is more commonly carried out at a reduced pressure. The vapor pressure of the metal complex should be low enough to be practical in such applications. The substrate temperature should be high enough to keep the bonds between the metal atoms at the surface intact and to prevent thermal decomposition of gaseous reactants. However, the substrate temperature should also be high enough to keep the source materials (i.e., the reactants) in the gaseous phase and to provide sufficient activation energy for the surface reaction. The appropriate temperature depends on various parameters, including the particular metal complex used and the pressure. The properties of a specific metal complex for use in the ALD deposition methods disclosed herein can be evaluated using methods known in the art, allowing selection of appropriate temperature and pressure for the reaction. In general, lower molecular weight and the presence of functional groups that increase the rotational entropy of the ligand sphere result in a melting point that yields liquids at typical delivery temperatures and increased vapor pressure.

A metal complex for use in the deposition methods will have all of the requirements for sufficient vapor pressure, sufficient thermal stability at the selected substrate temperature and sufficient reactivity to produce a reaction on the surface of the substrate without unwanted impurities in the thin film. Sufficient vapor pressure ensures that molecules of the source compound are present at the substrate surface in sufficient concentration to enable a complete self-saturating reaction. Sufficient thermal stability ensures that the source compound will not be subject to the thermal decomposition which produces impurities in the thin film.

Thus, the metal complexes disclosed herein utilized in these methods may be liquid, solid, or gaseous. Typically, the metal complexes are liquids or solids at ambient temperatures with a vapor pressure sufficient to allow for consistent transport of the vapor to the process chamber.

In one embodiment, an elemental metal, a metal nitride, a metal oxide, or a metal silicide film can be formed by delivering for deposition at least one metal complex as disclosed herein, independently or in combination with a co-reactant. In this regard, the co-reactant may be deposited or delivered to or passed over a substrate surface, independently or in combination with the at least one metal complex. As will be readily appreciated, the particular co-reactant used will determine the type of metal-containing film is obtained. Examples of such co-reactants include, but are not limited to hydrogen, hydrogen plasma, oxygen, air, water, an alcohol, $H_2O_2$, $N_2O$, ammonia, a hydrazine, a borane, a silane, ozone, or a combination of any two or more thereof. Examples of suitable alcohols include, without limitation, methanol, ethanol, propanol, isopropanol, tert-butanol, and the like. Examples of suitable boranes include, without limitation, hydridic (i.e., reducing) boranes such as borane, diborane, triborane and the like. Examples of suitable silanes include, without limitation, hydridic silanes such as silane, disilane, trisilane, and the like. Examples of suitable hydrazines include, without limitation, hydrazine ($N_2H_4$), a hydrazine optionally substituted with one or more alkyl groups (i.e., an alkyl-substituted hydrazine) such as methylhydrazine, tert-butylhydrazine, N,N- or N,N'-dimethylhydrazine, a hydrazine optionally substituted with one or more aryl groups (i.e., an aryl-substituted hydrazine) such as phenylhydrazine, and the like.

In one embodiment, the metal complexes disclosed herein are delivered to the substrate surface in pulses alternating with pulses of an oxygen-containing co-reactant as to provide metal oxide films. Examples of such oxygen-containing co-reactants include, without limitation, $H_2O$, $H_2O_2$, $O_2$, ozone, air, i-PrOH, t-BuOH, or $N_2O$.

In other embodiments, a co-reactant comprises a reducing reagent such as hydrogen. In such embodiments, an elemental metal film is obtained. In particular embodiments, the elemental metal film consists of, or consists essentially of, pure metal. Such a pure metal film may contain more than about 80, 85, 90, 95, or 98% metal. In even more particular embodiments, the elemental metal film is a scandium film or a yttrium film.

In other embodiments, a co-reactant is used to form a metal nitride film by delivering for deposition at least one metal complex as disclosed herein, independently or in combination, with a co-reactant such as, but not limited to, ammonia, a hydrazine, and/or other nitrogen-containing compounds (e.g., an amine) to a reaction chamber. A plurality of such co-reactants may be used. In further embodiments, the metal nitride film is a nickel nitride film.

In another embodiment, a mixed-metal film can be formed by a vapor deposition process which vaporizes at least one metal complex as disclosed herein in combination, but not necessarily at the same time, with a second metal complex comprising a metal other than that of the at least one metal complex disclosed herein.

In a particular embodiment, the methods of the present technology are utilized for applications such as dynamic random access memory (DRAM) and complementary metal oxide semi-conductor (CMOS) for memory and logic applications, on substrates such as silicon chips.

Any of the metal complexes disclosed herein may be used to prepare thin films of the elemental metal, metal oxide, metal nitride, and/or metal silicide. Such films may find application as oxidation catalysts, anode materials (e.g., SOFC or LIB anodes), conducting layers, sensors, diffusion barriers/coatings, super- and non-superconducting materials/coatings, tribological coatings, and/or, protective coatings. It is understood by one of ordinary skill in the art that the film properties (e.g., conductivity) will depend on a number of factors, such as the metal(s) used for deposition, the presence or absence of co-reactants and/or co-complexes, the thickness of the film created, the parameters and substrate employed during growth and subsequent processing.

Fundamental differences exist between the thermally-driven CVD process and the reactivity-driven ALD process. The requirements for precursor properties to achieve optimum performance vary greatly. In CVD a clean thermal decomposition of the complex to deposit the required species onto the substrate is critical. However, in ALD such a thermal decomposition is to be avoided at all costs. In ALD, the reaction between the input reagents must be rapid at the surface resulting in formation of the target material on the substrate. However, in CVD, any such reaction between species is detrimental due to their gas phase mixing before reaching the substrate, which could lead to particle formation. In general it is accepted that good CVD precursors do not necessarily make good ALD precursors due to the relaxed thermal stability requirement for CVD precursors. In this invention, Formula I metal complexes possess enough thermal stability and reactivity toward select co-reactants to function as ALD precursors, and they possess clean decomposition pathways at higher temperatures to form desired materials through CVD processes as well. Therefore, the metal complexes described by Formula I are advantageously useful as viable ALD and CVD precursors.

Reference throughout this specification to "one embodiment," "certain embodiments," "one or more embodiments" or "an embodiment" means that a particular feature, structure, material, or characteristic described in connection with the embodiment is included in at least one embodiment of the present technology. Thus, the appearances of the phrases such as "in one or more embodiments," "in certain embodiments," "in one embodiment" or "in an embodiment" in various places throughout this specification are not necessarily referring to the same embodiment of the present technology. Furthermore, the particular features, structures, materials, or characteristics may be combined in any suitable manner in one or more embodiments.

Although the present technology herein has been described with reference to particular embodiments, it is to be understood that these embodiments are merely illustrative of the principles and applications of the present technology. It will be apparent to those skilled in the art that various modifications and variations can be made to the method and apparatus of the present technology without departing from the spirit and scope of the present technology. Thus, it is intended that the present technology include modifications and variations that are within the scope of the appended claims and their equivalents. The present technology, thus generally described, will be understood more readily by reference to the following examples, which is provided by way of illustration and is not intended to be limiting.

The invention can additionally or alternatively include one or more of the following embodiments.

Embodiment 1

A metal complex corresponding in structure to Formula I: $[(R^1)_n Cp]_2 M^1 L^1$ (I), wherein $M^1$ is a Group 3 metal or a lanthanide (e.g., scandium, yttrium and lanthanum); each $R^1$ is independently hydrogen, $C_1$-$C_5$-alkyl or silyl; n is 1, 2, 3, 4, or 5; Cp is cyclopentadienyl ring; and $L^1$ is selected from the group consisting of: $NR^2R^3$; $N(SiR^4R^5R^6)_2$; 3,5-$R^7R^8$—$C_3HN_2$; 1-$(R^{32})C_3H_4$; 1-$R^{33}$-3-$R^{34}$—$C_3H_3$; and $R^{35}$, $R^{36}$—$C_3HO_2$; $R^{12}N$=C—$NR^{13}$; $R^{14}R^{15}N$—$CH_2$—$CH_2$—$NR^{16}$—$CH_2$—$CH_2$—$NR^{17}R^{18}$; and $R^{19}O$—$CH_2$—$CH_2$—$NR^{20}$—$CH_2$—$CH_2$—$OR^{21}$; wherein $R^2$, $R^3$, $R^4$, $R^5$, $R^6$, $R^7$, $R^8$, $R^{12}$, $R^{13}$, $R^4$, $R^{15}$, $R^{16}$, $R^{17}$, $R^{18}$, $R^{19}$, $R^{20}$, and $R^{21}$ are each independently hydrogen or $C_1$-$C_5$-alkyl; and $R^{32}$, $R^{33}$, $R^{34}$, $R^{35}$, and $R^{36}$ are each independently alkyl or silyl; optionally, wherein when $M^1$ is yttrium and $L^1$ is 3,5-$R^7R^8$—$C_3HN_2$, $R^1$ is $C_1$-$C_5$-alkyl or silyl; and optionally, wherein when $M^1$ is yttrium and $L^1$ is $N(SiR^4R^5R^6)_2$, n is 1, 2, 3, or 4.

Embodiment 2

The metal complex of embodiment 1, wherein each $R^1$ is independently hydrogen, $C_1$-$C_4$-alkyl or silyl; and $R^2$, $R^3$, $R^4$, $R^5$, $R^6$, $R^7$, and $R^8$ are each independently hydrogen or $C_1$-$C_4$-alkyl; and $R^{32}$, $R^{33}$, $R^{34}$, $R^{35}$, and $R^{36}$ are each independently $C_1$-$C_5$-alkyl or silyl.

Embodiment 3

The metal complex of embodiment 1 or 2, wherein each $R^1$ is independently hydrogen, methyl, ethyl, propyl or silyl, preferably hydrogen, methyl or ethyl, more preferably methyl; and $R^2$, $R^3$, $R^4$, $R^5$, $R^6$, $R^7$, and $R^8$ are each independently hydrogen, methyl, ethyl or propyl, preferably hydrogen methyl or ethyl, more preferably hydrogen or methyl; and $R^{32}$, $R^{33}$, $R^{34}$, $R^{35}$, and $R^{36}$ are each independently $C_1$-$C_4$-alkyl or silyl, preferably methyl, ethyl, propyl or silyl, more preferably $SiMe_3$.

Embodiment 4

The metal complex of any one of the previous embodiments, wherein each $R^1$ is independently hydrogen, $C_1$-$C_4$-alkyl or silyl; and $L^1$ is $NR^2R^3$, wherein $R^2$ and $R^3$ are each independently hydrogen or $C_1$-$C_4$-alkyl.

Embodiment 5

The metal complex of embodiment 4, wherein each $R^1$ is independently hydrogen, methyl, ethyl, propyl or silyl, preferably hydrogen, methyl, or ethyl, more preferably methyl; and $R^2$ and $R^3$ are each independently hydrogen, methyl, ethyl or propyl, preferably hydrogen, methyl or ethyl.

Embodiment 6

The metal complex of any one of the previous embodiments, wherein each $R^1$ is independently hydrogen, $C_1$-$C_4$-alkyl or silyl; and $L^1$ is $N(SiR^4R^5R^6)_2$, wherein $R^4$, $R^5$, and $R^6$ are each independently hydrogen or $C_1$-$C_4$-alkyl.

Embodiment 7

The metal complex of embodiment 6, wherein each $R^1$ is independently hydrogen, methyl, ethyl, propyl or silyl, preferably hydrogen, methyl, or ethyl, more preferably methyl; and $R^4$, $R^5$, and $R^6$ are each independently hydrogen, methyl, ethyl or propyl, preferably hydrogen, methyl or ethyl.

Embodiment 8

The metal complex of any one of the previous embodiments, wherein each $R^1$ is independently hydrogen, $C_1$-$C_4$- alkyl or silyl; and $L^1$ is 3,5-$R^7R^8$—$C_3HN_2$, wherein $R^7$ and $R^8$ are each independently hydrogen or $C_1$-$C_5$-alkyl.

Embodiment 9

The metal complex of embodiment 8, wherein each $R^1$ is independently hydrogen, methyl, ethyl, propyl or silyl, preferably hydrogen, methyl, or ethyl, more preferably methyl.

Embodiment 10

The metal complex of any one of the previous embodiments, wherein each $R^1$ is independently hydrogen, $C_1$-$C_4$-alkyl or silyl, preferably hydrogen, methyl, ethyl or silyl; and $L^1$ is 1-($R^{32}$)$C_3H_4$, wherein $R^{32}$ is $C_1$-$C_5$-alkyl or silyl, preferably $R^{32}$ is methyl, ethyl or silyl, more preferably $L^1$ is 1-(SiMe$_3$)$C_3H_4$.

Embodiment 11

The metal complex of any one of the previous embodiments, wherein each $R^1$ is independently hydrogen, $C_1$-$C_4$-alkyl or silyl, preferably hydrogen, methyl, ethyl or silyl; and $L^1$ is 1-$R^{33}$-3-$R^{34}$—$C_3H_3$, wherein $R^{33}$ and $R^{34}$ are each independently $C_1$-$C_5$-alkyl or silyl, preferably $R^{33}$ and $R^{34}$ are each independently methyl, ethyl or silyl, more preferably $L^1$ is 1,3-bis-(SiMe$_3$)$_2C_3H_3$.

Embodiment 12

The metal complex of any one of the previous embodiments, wherein each $R^1$ is independently hydrogen, $C_1$-$C_4$-alkyl or silyl, preferably hydrogen, methyl, ethyl or silyl; and $L^1$ is $R^{35}$, $R^{36}$—$C_3HO_2$, wherein $R^{35}$ and $R^{36}$ are each independently $C_1$-$C_5$-alkyl or silyl, preferably $R^{35}$ and $R^{36}$ are each independently methyl, ethyl, propyl, butyl, or silyl, more preferably $L^1$ is 6-methyl-2,4-heptanedionate, i.e., Me, iBu-$C_3HO_2$.

Embodiment 13

The metal complex of any one of the previous embodiments, wherein the complex is: Sc(MeCp)$_2$[1-(SiMe$_3$)$C_3H_4$]; Sc(MeCp)$_2$[1,3-bis-(SiMe$_3$)$_2C_3H_3$]; Sc(MeCp)$_2$[N(SiMe$_3$)$_2$]; Sc(MeCp)$_2$(3,5-Me$_2$—$C_3HN_2$); Sc(MeCp)$_2$(Me, iBu-$C_3HO_2$), preferably Sc(MeCp)$_2$[1-(SiMe$_3$)$C_3H_4$]; Sc(MeCp)$_2$[1,3-bis-(SiMe$_3$)$_2C_3H_3$]; Sc(MeCp)$_2$[N(SiMe$_3$)$_2$]; and Sc(MeCp)$_2$(3,5-Me$_2$—$C_3HN_2$).

Embodiment 14

A metal complex corresponding in structure to Formula II: [(($R^9$)$_n$Cp)$_2M^2L^2$]$_2$(II), wherein $M^2$ is a Group 3 metal or a lanthanide (e.g., scandium, yttrium and lanthanum); each $R^9$ is independently hydrogen or $C_1$-$C_5$-alkyl; n is 1, 2, 3, 4 or 5; Cp is cyclopentadienyl ring; and $L^2$ is selected from the group consisting of: Cl; F; Br; I; 3,5-$R^{10}R^{11}$—$C_3HN_2$; $R^{22}$N=C—C—N$R^{23}$; $R^{24}R^{25}$N—CH$_2$—N$R^{26}$—CH$_2$—N$R^{27}R^{28}$, and $R^{29}$O—CH$_2$—N$R^{30}$—CH$_2$—O$R^{31}$; wherein $R^{10}$, $R^{11}$, $R^{22}$, $R^{23}$, $R^{24}$, $R^{25}$, $R^{26}$, $R^{27}$, $R^{28}$, $R^{29}$, $R^{30}$, and $R^{31}$ are each independently hydrogen or $C_1$-$C_5$-alkyl, optionally wherein when $M^2$ is scandium and $L^2$ is Cl, $R^9$ is $C_1$-$C_5$-alkyl.

Embodiment 15

The metal complex of embodiment 14, wherein each $R^9$ is independently $C_1$-$C_5$-alkyl Embodiment 16

The metal complex of embodiment 14 or 15, wherein each $R^9$ is independently hydrogen or $C_1$-$C_4$-alkyl, preferably hydrogen, methyl, ethyl or propyl, preferably hydrogen, methyl, or ethyl, more preferably methyl.

Embodiment 17

The metal complex of embodiments 14, 15 or 16, wherein $M^2$ is scandium; each $R^9$ is independently a $C_1$-$C_4$-alkyl, preferably methyl, ethyl or propyl, more preferably methyl; and preferably $L^2$ is Cl.

Embodiment 18

The metal complex of embodiments 14, 15 or 16, wherein $M^2$ is yttrium; each $R^9$ is independently a $C_1$-$C_5$-alkyl, preferably methyl, ethyl or propyl; more preferably methyl or ethyl; and preferably $L^2$ is 3,5-$R^{10}R^{11}$—$C_3HN_2$ and each $R^9$ is independently.

Embodiment 19

The metal complex of embodiments 14, 15, 16, 17 or 18, wherein the complex is [Sc(MeCp)$_2$Cl]$_2$; and [Y(MeCp)$_2$(3,5-MePn—$C_3HN_2$)]$_2$.

Embodiment 20

A method of forming a metal-containing film by a vapor deposition process, the method comprising vaporizing at least one metal complex according to any one of the previous embodiments.

Embodiment 21

The method of embodiment 20, wherein the vapor deposition process is chemical vapor deposition, preferably pulsed chemical vapor deposition, continuous flow chemical vapor deposition, and/or liquid injection chemical vapor deposition.

Embodiment 22

The method of embodiment 20, wherein the vapor deposition process is atomic layer deposition, preferably liquid injection atomic layer deposition or plasma-enhanced atomic layer deposition.

Embodiment 23

The method of any one of embodiments 20, 21 or 22, wherein the metal complex is delivered to a substrate in pulses alternating with pulses of an oxygen source, preferably the oxygen source is selected from the group consisting of $H_2O$, $H_2O_2$, $O_2$, ozone, air, i-PrOH, t-BuOH, and $N_2O$.

Embodiment 24

The method of any one of embodiments 20, 21, 22, or 23 further comprising vaporizing at least one co-reactant selected from the group consisting of hydrogen, hydrogen plasma, oxygen, air, water, ammonia, a hydrazine, a borane, a silane, ozone, and a combination of any two or more thereof, preferably the at least one co-reactant is a hydrazine (e.g., hydrazine ($N_2H_4$), N,N-dimethylhydrazine).

Embodiment 25

The method of any one of embodiments 20, 21, 22, 23 or 24, wherein the method is used for a DRAM or CMOS application.

EXAMPLES

Unless otherwise noted, all synthetic manipulations are performed under an inert atmosphere (e.g., purified nitrogen or argon) using techniques for handling air-sensitive materials commonly known in the art (e.g., Schlenk techniques).

Example 1: Preparation of Complex 11 ([Sc(MeCp)$_2$Cl]$_2$)

A 500 mL Schlenk flask equipped with a magnetic stirrer was charged with ScCl$_3$ (15.5 g, 0.102 mol) and KMeCp (24.2 g, 0.205 mol) followed by anhydrous diethyl ether (200 mL). The mixture was stirred at room temperature (~18° C. to ~24° C.) for 12 hours under a nitrogen atmosphere, giving a maroon colored suspension. The solvent was removed under pressure and the resulting solid was extracted with 5×50 mL toluene, and filtered through a medium frit. The filtrate was removed from the solvent under reduced pressure to afford the final product as a yellow powder (16.4 g, 0.0344 mol, 67% yield). $^1$H NMR (C$_6$D$_6$) of product: δ 2.02 (12H, MeC$_5$H$_4$), 6.09 (8H, MeC$_5$H$_4$), 6.24 (8H, MeC$_5$H$_4$). $^{13}$C NMR (C$_6$D$_6$) of product: δ 15.4 (MeC$_5$H$_4$), 114.4 (MeC$_5$H$_4$), 116.0 (MeC$_5$H$_4$), 124.9 (MeC$_5$H$_4$).

Example 2: Preparation of Complex 3 (Sc(MeCp)$_2$[N(SiMe$_3$)$_2$])

A 250 mL Schlenk flask equipped with magnetic stirrer was charged with [Sc(MeCp)$_2$Cl]$_2$ (4.6 g, 0.0098 mol) and KN(SiMe$_3$)$_2$ (3.9 g, 0.020 mol) followed by anhydrous diethyl ether (100 mL). The mixture was stirred at room temperature (~18° C. to ~24° C.) for 12 hours under a nitrogen atmosphere, giving a peach-colored suspension. The solvent was removed under pressure and the resulting solid was extracted with 3×30 mL hexane, and filtered through a medium frit. The filtrate was removed from the solvent under reduced pressure to afford the final product as a yellow powder. (6.7 g, 0.018 mol, 90% yield). $^1$H NMR (C$_6$D$_6$) of product: δ 1.10 (18H, SiMe$_3$), 2.04 (6H, MeC$_5$H$_4$), 5.85 (4H, MeC$_5$H$_4$), 6.00 (4H, MeC$_5$H$_4$). $^{13}$C NMR (C$_6$D$_6$) of product: δ 4.2 (SiMe$_3$), 15.7 (MeC$_5$H$_4$), 114.3 (MeC$_5$H$_4$), 115.9 (MeC$_5$H$_4$), 125.0 (MeC$_5$H$_4$).

Example 3: Synthesis of Complex 2 (Sc(MeCp)$_2$[1,3-bis(trimethylsilyl)allyl])

A 250 mL Schlenk flask equipped with a magnetic stirrer was charged with [Sc(MeCp)$_2$Cl]$_2$ (1.0 g, 2.1 mmol) and K(1,3-bis-trimethylsilyl-allyl) (1.05 g, 4.7 mmol) followed by addition of anhydrous diethyl ether (100 mL). The mixture was stirred at room temperature (~18° C. to ~24° C.) for 12 hours under a nitrogen atmosphere, giving an orange suspension. The solvent was removed under reduced pressure and the resulting solid was extracted with 3×30 mL hexane, and filtered through a medium frit. The filtrate was removed of solvent under reduced pressure to afford the final product as a red liquid. (1.0 g, 2.6 mmol, 62% yield). $^1$H NMR (C$_6$D$_6$) of product: δ 0.04 (18H, SiMe$_3$), 1.84 (3H, MeC5H4), 1.94 (3H, MeC$_5$H$_4$), 4.90 (2H, allyl CH(TMS)), 5.97 (2H, MeC$_5$H$_4$), 6.04 (4H, MeC$_5$H$_4$), 6.29 (2H, MeC$_5$H$_4$), 7.67 (1H, allyl CH).

Example 4: Synthesis of Complex 1 (Sc(MeCp)$_2$(1-trimethylsilylallyl))

A 250 mL Schlenk flask equipped with a magnetic stirrer was charged with [Sc(MeCp)$_2$Cl]$_2$ (5.2 g, 10.9 mmol) and K(trimethylsilyl-allyl) (3.3 g, 21.8 mmol) followed by addition of anhydrous diethyl ether (100 mL). The mixture was stirred at room temperature (~18° C. to ~24° C.) for 12 hours under a nitrogen atmosphere, giving an orange suspension. The solvent was removed under reduced pressure and the resulting solid was extracted with 3×30 mL pentane, and filtered through a medium frit. The filtrate was removed of solvent under reduced pressure to afford the final product as a red liquid. (3.7 g, 11.7 mmol, 54% yield). $^1$H NMR (C$_6$D$_6$) of product: δ −0.02 (9H, SiMe$_3$), 1.82 (6H, MeC$_5$H$_4$), 2.29 (1H, allyl CH$_2$), 4.15 (1H, allyl CH$_2$), 4.73 (1H, allyl CH(TMS)), 5.94 (8H, MeC$_5$H$_4$), 7.47 (1H, allyl CH).

Example 5: Synthesis of Complex 4 (Sc(MeCp)$_2$(3,5-dimethyl-pyrazolate))

A 500 mL Schlenk flask equipped with a magnetic stirrer was charged with [Sc(MeCp)$_2$Cl]$_2$ (12.0 g, 25.1 mmol) and KMe$_2$Pz (6.75 g, 50.3 mmol) followed by addition of anhydrous THF (150 mL). The mixture was stirred at room temperature (~18° C. to ~24° C.) for 12 hours under a nitrogen atmosphere. The solvent was removed under reduced pressure and the resulting yellow sticky solid was extracted with 5×20 mL toluene, and filtered through a medium frit. The filtrate was removed of solvent under reduced pressure to provide a red oil. Further distillation under vacuum afforded the final product as a light yellow liquid (10.7 g, 35.9 mmol, 72% yield). $^1$H NMR (C$_6$D$_6$) of product: δ 1.85 (6H, MeC$_5$H$_4$), 2.28 (6H, Me$_2$Pz), 5.84 (4H, MeC$_5$H$_4$), 5.96 (1H, Me$_2$Pz), 6.20 (4H, MeC$_5$H$_4$).

Example 6: Synthesis of Complex 8 (Y(MeCp)$_2$(3-methyl-5-pentyl-pyrazolate))

A 500 mL Schlenk flask equipped with a magnetic stirrer was charged with [Y(MeCp)$_2$Cl]$_2$ (9.33 g, 16.5 mmol) and K(Me,Pn)Pz (6.28 g, 33.0 mmol) followed by addition of anhydrous THF (150 mL). The mixture was stirred at room temperature for 12 hours (~18° C. to ~24° C.) under a nitrogen atmosphere. The solvent was removed under reduced pressure and the resulting yellow sticky solid was extracted with 5×20 mL toluene, and filtered through a medium frit. The filtrated was removed of solvent under reduced pressure to provide a red oil. Further distillation under vacuum afforded the final product as a light yellow liquid (7.7 g, 19.3 mmol, 58% yield). $^1$H NMR (C$_6$D$_6$) of product: δ 0.94 (3H, Pentyl), 1.40 (4H, Pentyl), 1.75 (2H, Pentyl), 2.16 (6H, MeC$_5$H$_4$), 2.17 (3H, $^{Me,Pn}$Pz), 2.65 (2H, Pentyl), 5.66 (4H, MeC$_5$H$_4$), 5.90 (1H, $^{Me,Pn}$Pz), 5.96 (4H, MeC$_5$H$_4$).

Example 7: Synthesis of Complex 9 (Sc(MeCp)$_2$(6-methyl-2,4-heptanedionate))

A 500 mL Schlenk flask equipped with a magnetic stirrer was charged with [Sc(MeCp)$_2$Cl]$_2$ (1.0 g, 1.8 mmol) and K(6-Methyl-2,4-heptanedionate) (0.67 g, 3.7 mmol) followed by addition of anhydrous THF (150 mL). The mixture was stirred at room temperature for 12 hours (~18° C. to ~24° C.) under a nitrogen atmosphere. The solvent was removed under reduced pressure and the resulting yellow sticky solid was extracted with 3×20 mL toluene, and filtered through a medium frit. The filtrated was removed of solvent under reduced pressure to provide an orange oil (0.8 g, 2.1 mmol, 58% yield). $^1$H NMR ($C_6D_6$) of product: δ 0.89 (6H, $^t$Bu), 1.71 (3H, Me), 1.89 (2H, $^t$Bu), 2.03 (6H, $MeC_5H_4$), 2.04 (1H, $^t$Bu), 5.24 (1H, diketonate), 5.85 (4H, $MeC_5H_4$), 6.05 (2H, $MeC_5H_4$), 6.14 (2H, $MeC_5H_4$).

Example 8: Synthesis of Complex 10 ($Y(MeCp)_2$ (6-Methyl-2,4-heptanedionate))

A 500 mL Schlenk flask equipped with a magnetic stirrer was charged with $[Y(MeCp)_2Cl]_2$ (1.5 g, 2.4 mmol) and K(6-Methyl-2,4-heptanedionate) (0.89 g, 4.9 mmol) followed by addition of anhydrous THF (150 mL). The mixture was stirred at room temperature for 12 hours (~18° C. to ~24° C.) under a nitrogen atmosphere. The solvent was removed under reduced pressure and the resulting yellow sticky solid was extracted with 3×20 mL toluene, and filtered through a medium frit. The filtrated was removed of solvent under reduced pressure to provide an orange oil (1.2 g, 2.9 mmol, 60% yield). $^1$H NMR ($C_6D_6$) of product: δ 0.89 (6H, $^t$Bu), 1.72 (3H, Me), 1.91 (2H, $^t$Bu), 2.04 (1H, $^t$Bu), 2.10 (6H, $MeC_5H_4$), 5.25 (1H, diketonate), 5.95 (4H, $MeC_5H_4$), 6.10 (2H, $MeC_5H_4$), 6.15 (2H, $MeC_5H_4$).

Example 9: ALD of $Sc_2O_3$ Film Using Complex 4 ($Sc(MeCp)_2$(3,5-dimethyl-pyrazolate)) and Water $Sc(MeCp)_2$(3,5-dimethyl-pyrazolate) was heated to 100-115° C. in a stainless steel bubbler and delivered into an ALD reactor using about 20 sccm of nitrogen as the carrier gas, and pulsed for about 2 seconds followed by a ~28-58 second purge. A pulse of water vapor (1 second) was then delivered from a room temperature cylinder of water followed by a 60-second nitrogen purge. A needle valve was present between the deposition chamber and the water cylinder, and was adjusted so as to have an adequate water vapor dose. The scandium oxide was deposited at about 175-300° C. for up to 300 cycles onto silicon chips having a thin layer of native oxide, $SiO_2$. The film was cooled down in the reactor to about 60° C. under vacuum with nitrogen purge before unloading. Film thicknesses in the range of 60-260 Å were obtained, and preliminary results show a growth rate of ~1 Angstrom/cycle. XPS (X-ray Photoelectron Spectroscopy) analysis confirmed the existence of scandium oxide with N and C contaminants on the top surface, which were removed during the XPS analysis. The XPS data in FIGS. 1-14 shows the films have no more than 1% of any element except the desired scandium and oxygen once the surface contamination has been removed by sputtering. In the bulk, only Sc and O were detected, and the stoichiometry measured matched the theoretical composition of $Sc_2O_3$.

Example 10: ALD of $Y_2O_3$ Film Using Complex 12 ($[Y(MeCp)_2(3,5-MePn—C_3HN_2)]_2$)

General Methods $[Y(MeCp)_2(3,5-MePn—C_3HN_2)]_2$ was heated to 130-180° C. in a stainless steel bubbler, delivered into a cross-flow ALD reactor using nitrogen as a carrier gas and deposited by ALD using water. $H_2O$ was delivered by vapor draw from a stainless steel ampule at room temperature. Silicon chips having a native $SiO_2$ layer in the range of 14-17 Å thick were used as substrates. As-deposited films were used for thickness and optical property measurements using an optical ellipsometer. Selected samples were analyzed by XPS for film composition and impurity concentrations.

Example 10a $[Y(MeCp)_2(3,5-MePn—C_3HN_2)]_2$ was heated to 170° C., delivered into an ALD reactor using 20 sccm of nitrogen as the carrier gas, and pulsed for 7 seconds from a bubbler followed by a 20 second of $N_2$ purge, followed by a 0.015 second pulse of $H_2O$ and 90 second of $N_2$ purge in each ALD cycle, and deposited at multiple temperatures from 125 to 250° C. for 200 or more cycles. As-deposited films were cooled down in the reactor to ~80° C. under nitrogen purge before unloading. Film thickness in the range of 150 to 420 Å was deposited. Growth rate per cycle data at a fixed reactor inlet position were plotted in FIG. 15.

Figure 15:
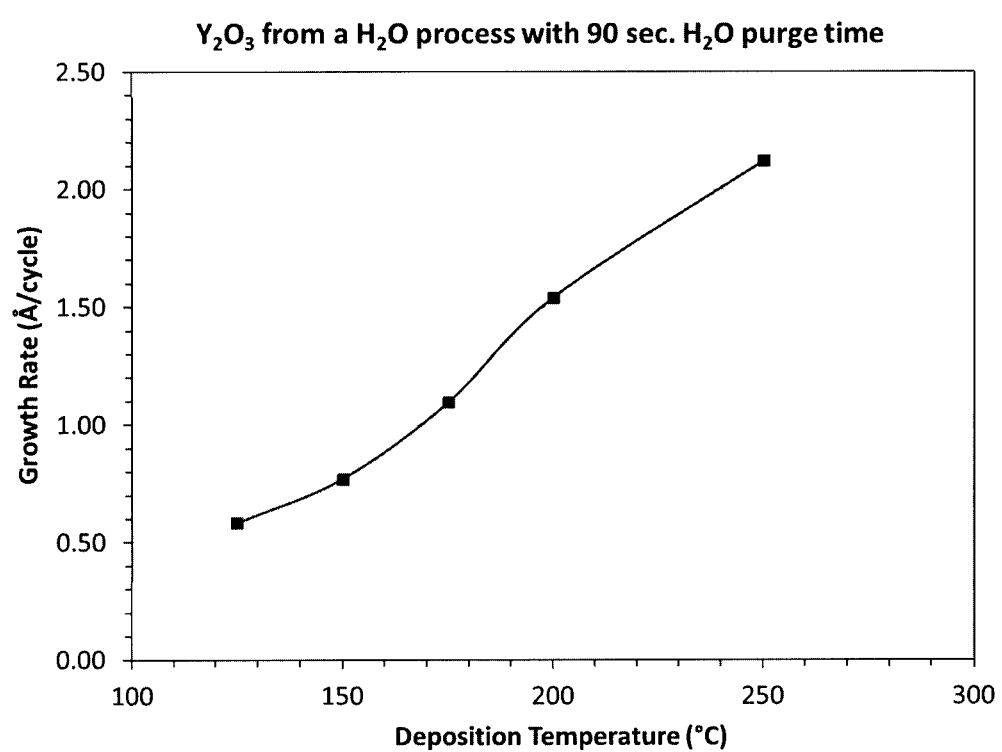
FIG. 15 illustrates dependence of ALD $Y_2O_3$ growth rate per cycle on the deposition temperature when depositing [Y(MeCp)$_2$(3,5-MePn—$C_3HN_2$)]$_2$.
Figure 16:
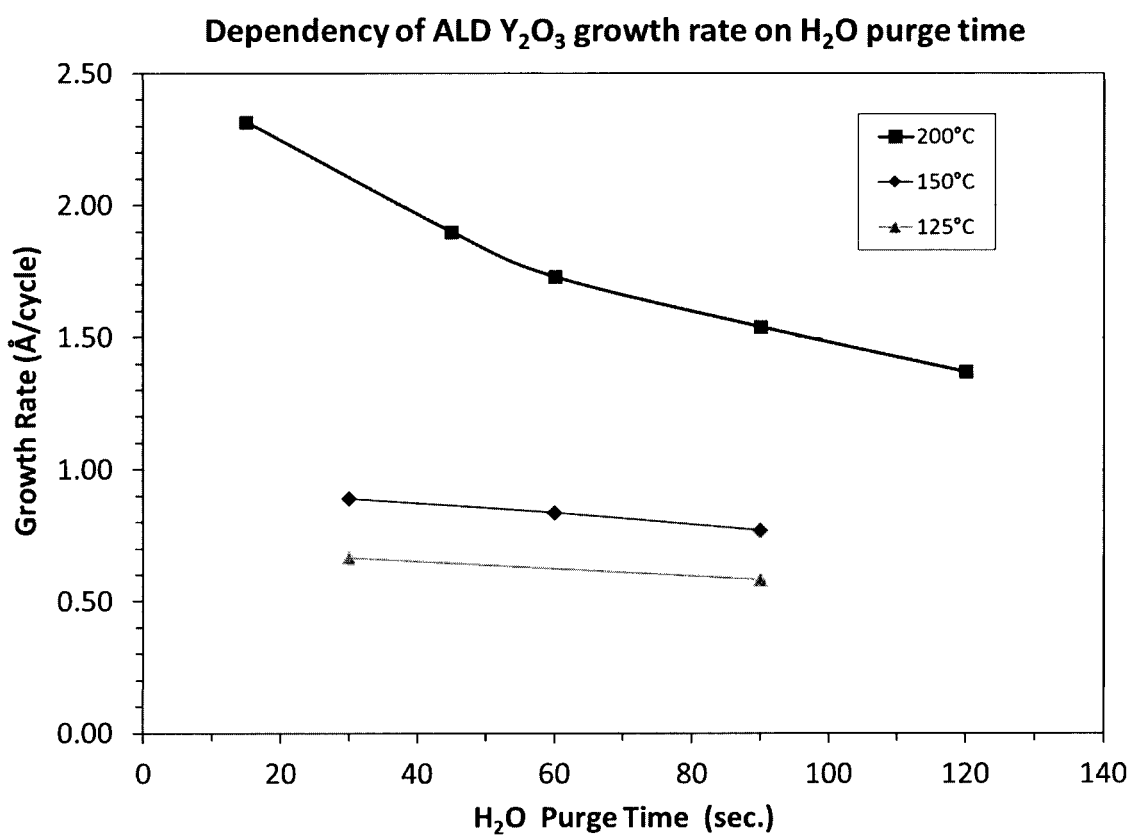
FIG. 16 illustrates dependence of ALD $Y_2O_3$ growth rate per cycle on $H_2O$ purge time when depositing [Y(MeCp)$_2$(3,5-MePn—$C_3HN_2$)]$_2$ at 125° C., 150° C. and 200° C.

The curve in FIG. 15 indicates that the growth rate of $Y_2O_3$ from an un-optimized $H_2O$ ALD process appeared to be temperature dependent under the same deposition conditions. The higher the temperature, the higher the growth rate. Further tests revealed that the growth rate at higher temperatures appeared to be affected by the $H_2O$ purge time, which may be due to initial formation of $Y(OH)_3$ and/or strong absorption of $H_2O$ by the $Y_2O_3$ film at higher temperatures. For example, no saturation was reached even after 120 seconds of $H_2O$ purge at 200° C., while its dependence on the $H_2O$ purge time is much smaller at ~150° C. or lower as shown in FIG. 16.

Figure 17:
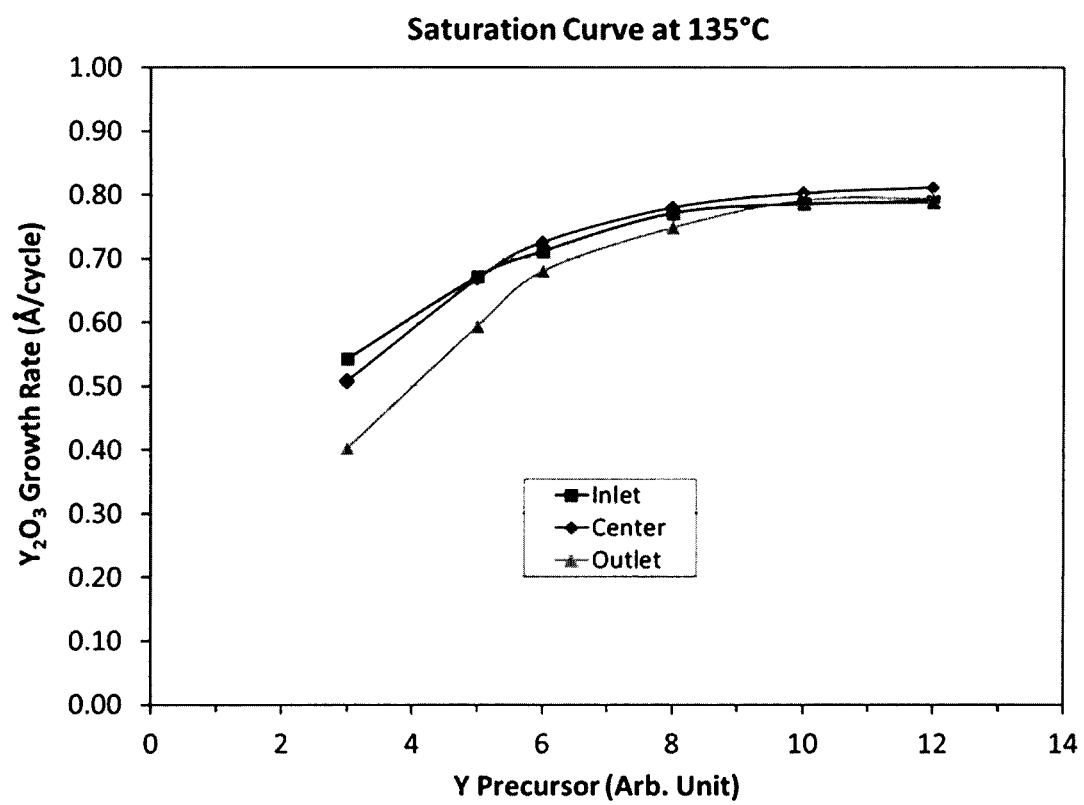
FIG. 17 illustrates ALD $Y_2O_3$ growth rate per cycle at 3 different positions in a cross-flow reactor along the precursor/carrier gas flow direction, the precursor inlet, the reactor center, and precursor outlet.

Example 10b $[Y(MeCp)_2(3,5-MePn—C_3HN_2)]_2$ was heated to 170-176° C., delivered into an ALD reactor using 20 sccm of nitrogen as the carrier gas, and pulsed from 3 to 13 seconds from a bubbler to generate various precursor doses, followed by a 60 second of $N_2$ purge, then by a 0.015 second pulse of $H_2O$ and 30 second of $N_2$ purge in each ALD cycle, and deposited at 135° C. for 350 cycles. The film thickness was monitored at 3 different positions in the cross-flow reactor along the precursor/carrier gas flow direction, the precursor inlet, the reactor center, and precursor outlet. Growth rate per cycle data are plotted in FIG. 17.

The saturation of the growth rate per cycle (GPC) at ~0.79 Å/cycle with the precursor dose as well as the convergence of the growth rates at the three different positions suggest that the process at 135° C. is truly an ALD process with insignificant contribution of any CVD component to the growth rate. Under optimized saturated growth conditions, an excellent thickness uniformity of ≤±1.3% over a 6~7" diameter area of the cross-flow reactor has been achieved.

The full ALD window with deposition temperature has not yet been determined. This precursor was thermally stable at higher temperatures ≥250° C.

All publications, patent applications, issued patents and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

The words "comprise", "comprises", and "comprising" are to be interpreted inclusively rather than exclusively.

What is claimed is:

1. A metal complex corresponding in structure to Formula I:

$$[(R^1)_n Cp]_2 M^1 L^1 \quad (I)$$

wherein
M$^1$ is scandium;
each R$^1$ is independently C$_1$-C$_5$-alkyl or silyl;
n is 1, 2, 3, 4, or 5;
Cp is cyclopentadienyl ring; and
L$^1$ is selected from the group consisting of: N(SiR$^4$R$^5$R$^6$)$_2$; 3,5-R$^7$R$^8$—C$_3$HN$_2$; 1-(R$^{32}$)C$_3$H$_4$; 1-R$^{33}$-3-R$^{34}$—C$_3$H$_3$; and R$^{35}$, R$^{36}$—C$_3$HO$_2$; wherein R$^4$, R$^5$, R$^6$, R$^7$, and R$^8$ are each independently C$_1$-C$_5$-alkyl; R$^{33}$, R$^{34}$, R$^{35}$, and R$^{36}$ are each independently alkyl or silyl; and R$^{32}$ is silyl.

2. The metal complex of claim 1, wherein each R$^1$ is independently methyl, ethyl, propyl or silyl; R$^4$, R$^5$, R$^6$, R$^7$ and R$^8$ are each independently methyl, ethyl or propyl; and R$^{33}$, R$^{34}$, R$^{35}$, and R$^{36}$ are each independently C$_1$-C$_4$-alkyl or silyl.

3. The metal complex of claim 1, wherein each R$^1$ is independently methyl or ethyl; R$^4$, R$^5$, R$^6$, R$^7$, and R$^8$ are each independently methyl, or ethyl; and R$^{33}$, R$^{34}$, R$^{35}$, and R$^{36}$ are each independently methyl, ethyl, propyl or silyl.

4. The metal complex of claim 1, wherein each R$^1$ is methyl; R$^4$, R$_5$, R$_6$, R$^7$, and R$^8$ are each independently methyl; and R$^{32}$, R$^{33}$, R$^{34}$, R$^{35}$, and R$^{36}$ are each SiMe$_3$.

5. The metal complex of claim 1, wherein each R$^1$ is independently hydrogen, C$_1$-C$_4$-alkyl or silyl; and L$^1$ is 1-(SiMe$_3$)C$_3$H$_4$ or L$^1$ is 1,3-bis-(SiMe$_3$)$_2$C$_3$H$_3$.

6. The metal complex of claim 1, wherein the complex is:
Sc(MeCp)$_2$[1-(SiMe$_3$)C$_3$H$_4$];
Sc(MeCp)$_2$[1,3-bis-(SiMe$_3$)$_2$C$_3$H$_3$];
Sc(MeCp)$_2$[N(SiMe$_3$)$_2$]; or
Sc(MeCp)$_2$(3,5-Me$_2$—C$_3$HN$_2$).

7. A metal complex corresponding in structure to Formula II:

$$[((R^9)_n Cp)_2 M^2 L^2]_2 \quad (II)$$

wherein
M$^2$ is scandium;
each R$^9$ is independently C$_1$-C$_5$-alkyl;
n is 1, 2, 3, 4 or 5;
Cp is cyclopentadienyl ring; and
L$^2$ is selected from the group consisting of: Cl, F, Br, I, and 3,5-R$^{10}$R$^{11}$—C$_3$HN$_2$; wherein
R$^{10}$ and R$^{11}$ are each independently hydrogen or C$_1$-C$_5$-alkyl;
wherein when L$^2$ is Cl, then R$^9$ is C$_1$-C$_5$-alkyl.

8. The metal complex of claim 7, wherein each R$^9$ is independently C$_1$-C$_4$-alkyl.

9. The metal complex of claim 7, wherein L$^2$ is Cl and each R$^9$ is independently methyl, ethyl or propyl.

10. The metal complex of claim 7, wherein the complex is: [Sc(MeCp)$_2$]Cl]$_2$.

11. A method of forming a metal-containing film by a vapor deposition process, the method comprising vaporizing at least one metal complex corresponding in structure to Formula I:

$$(R^1 Cp)_2 M^1 L^1 \quad (I)$$

wherein
M$^1$ is scandium;
each R$^1$ is independently C$_1$-C$_5$-alkyl or silyl;
Cp is cyclopentadienyl ring; and
L$^1$ is selected from the group consisting of: N(SiR$^4$R$^5$R$^6$)$_2$; 3,5-R$^7$R$^8$—C$_3$HN$_2$; 1-(R$^{32}$)C$_3$H$_4$; 1-R$^{33}$-3-R$^{34}$—C$_3$H$_3$; and R$^{35}$, R$^{36}$—C$_3$HO$_2$; wherein R$^4$, R$^5$, R$^6$, R$^7$, and R$^8$ are each independently C$_1$-C$_5$-alkyl; R$^{33}$, R$^{34}$, R$^{35}$, and R$^{36}$ are each independently alkyl or silyl; and R$^{32}$ is silyl.

12. The method of claim 11, wherein each R$^1$ is independently methyl, ethyl, propyl, or silyl; R$^4$, R$^5$, R$^6$, R$^7$, and R$^8$ are each independently methyl, ethyl or propyl; and R$^{33}$, R$^{34}$, R$^{35}$, and R$^{36}$ are each independently C$_1$-C$_4$-alkyl or silyl.

13. The method of claim 11, wherein each R$^1$ is independently methyl, or ethyl; and R$^4$, R$^5$, R$^6$, R$^7$, R$^8$ are each independently methyl, or ethyl; and R$^{33}$, R$^{34}$, R$^{35}$, and R$^{36}$ are each independently methyl, ethyl, propyl or silyl.

14. The method of claim 11, wherein each R$^1$ is methyl; R$^4$, R$^5$, R$^6$, R$^7$, and R$^8$ are each independently methyl; and R$^{32}$, R$^{33}$, R$^{34}$, R$^{35}$, and R$^{36}$ are each SiMe$_3$.

15. The method of claim 11, wherein each R$^1$ is independently C$_1$-C$_4$-alkyl or silyl; and L$^1$ is 1-(SiMe$_3$)C$_3$H$_4$ or L$^1$ is 1,3-bis-(SiMe$_3$)$_2$C$_3$H$_3$.

16. The method of claim 11, wherein the complex is:
Sc(MeCp)$_2$[1-(SiMe$_3$)C$_3$H$_4$];
Sc(MeCp)$_2$[1,3-bis-(SiMe$_3$)$_2$C$_3$H$_3$];
Sc(MeCp)$_2$[N(SiMe$_3$)$_2$]; and/or
Sc(MeCp)$_2$(3,5-Me$_2$—C$_3$HN$_2$).

17. The method of claim 11, wherein the vapor deposition process is chemical vapor deposition or atomic layer deposition, wherein the chemical vapor deposition is pulsed chemical vapor deposition, continuous flow chemical vapor deposition, or liquid injection chemical vapor deposition, and wherein the atomic layer deposition is liquid injection atomic layer deposition or plasma-enhanced atomic layer deposition.

18. The method of claim 11, wherein the metal complex is delivered to a substrate in pulses alternating with pulses of an oxygen source, wherein the oxygen source is selected from the group consisting of H$_2$O, H$_2$O$_2$, O$_2$, ozone, air, i-PrOH, t-BuOH, and N$_2$O.

19. The method of claim 11, further comprising vaporizing at least one co-reactant selected from the group consisting of hydrogen, hydrogen plasma, oxygen, air, water, ammonia, a hydrazine, a borane, a silane, ozone, and a combination of any two or more thereof, wherein the hydrazine is hydrazine (N$_2$H$_4$) or N,N-dimethylhydrazine.

* * * * *

UNITED STATES PATENT AND TRADEMARK OFFICE
CERTIFICATE OF CORRECTION

PATENT NO. : 11,312,730 B2
APPLICATION NO. : 16/347028
DATED : April 26, 2022
INVENTOR(S) : Fang et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 137 days.

Signed and Sealed this
Thirty-first Day of January, 2023

Katherine Kelly Vidal
*Director of the United States Patent and Trademark Office*